US008865258B2

(12) United States Patent
Honda et al.

(10) Patent No.: US 8,865,258 B2
(45) Date of Patent: *Oct. 21, 2014

(54) METHOD OF MANUFACTURING THIN FILM WHICH SUPPRESSES UNNECESSARY SCATTERING AND DEPOSITION OF A SOURCE MATERIAL

(75) Inventors: Kazuyoshi Honda, Osaka (JP); Kunihiko Bessho, Osaka (JP); Takashi Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 282 days.

This patent is subject to a terminal disclaimer.

(21) Appl. No.: 13/392,433

(22) PCT Filed: Jun. 1, 2011

(86) PCT No.: PCT/JP2011/003083
§ 371 (c)(1),
(2), (4) Date: Feb. 24, 2012

(87) PCT Pub. No.: WO2011/158452
PCT Pub. Date: Dec. 22, 2011

(65) Prior Publication Data
US 2012/0148746 A1 Jun. 14, 2012

(30) Foreign Application Priority Data
Jun. 16, 2010 (JP) ................ 2010-137223

(51) Int. Cl.
C23C 14/00 (2006.01)
C23C 14/24 (2006.01)
C23C 14/56 (2006.01)
C23C 14/54 (2006.01)

(52) U.S. Cl.
CPC ............ *C23C 14/24* (2013.01); *C23C 14/243* (2013.01); *C23C 14/562* (2013.01); *C23C 14/542* (2013.01)
USPC .................................. 427/248.1

(58) Field of Classification Search
USPC ............................. 427/248.1, 593
See application file for complete search history.

(56) References Cited

U.S. PATENT DOCUMENTS 5,803,976 A * 9/1998 Baxter et al. .............. 118/726
6,080,679 A   6/2000 Suzuki
(Continued)

FOREIGN PATENT DOCUMENTS

EP   0652302 A1   5/1995
JP   61-240436    10/1986
(Continued)

OTHER PUBLICATIONS

Lowe, John. Variation of Vapor Pressure with Temperature. Jun. 1990. Retrieved Jan. 10, 2014 from courses.chem.psu.edu/chem12h/vapor.pdf.*

(Continued)

*Primary Examiner* — David Turocy
(74) *Attorney, Agent, or Firm* — McDermott Will & Emery LLP

(57) ABSTRACT

The present invention provides a thin film manufacturing method which realizes stable, highly-efficient film formation using a nozzle-type evaporation source while avoiding unnecessary scattering and deposition of a film formation material after the termination of the film formation. Used is a film forming apparatus including: an evaporation chamber 16; a film forming chamber 17 in which a substrate 21 is provided; an evaporation source 19 holding a film formation material 15 and including an opening surface 14; a moving mechanism 35 configured to cause the evaporation source 19 to move; and a conductance variable structure 34. The film formation is performed in a state where the opening surface 14 of the evaporation source 19 holding the heated film formation material is located close to the substrate 21 while evacuating the evaporation chamber 16 and the film forming chamber 17 without shutting off communication between the evaporation chamber 16 and the film forming chamber 17 by the conductance variable structure 34. Next, the evaporation of the film formation material is suppressed by introducing a nonreactive gas to the evaporation chamber 16 and the film forming chamber 17 to adjust pressure in each chamber to predetermined pressure or more. Then, the evaporation source 19 is moved by the moving mechanism 35 such that the opening surface 14 is located away from the substrate 21. The conductance variable structure is activated to shut off the communication between these chambers, and the film formation material is cooled while continuously introducing the nonreactive gas to the evaporation chamber 16.

4 Claims, 18 Drawing Sheets

(56) References Cited

U.S. PATENT DOCUMENTS

| | | | |
|---|---|---|---|
| 6,101,316 A * | 8/2000 | Nagashima et al. | 392/388 |
| 6,275,649 B1 | 8/2001 | Nagashima et al. | |
| 6,641,674 B2 * | 11/2003 | Peng | 118/727 |
| 6,946,406 B2 * | 9/2005 | Yamazaki et al. | 438/781 |
| 7,871,667 B2 * | 1/2011 | Awata et al. | 427/248.1 |
| 2002/0132047 A1 | 9/2002 | Yamazaki et al. | |
| 2002/0139305 A1 | 10/2002 | Peng | |

FOREIGN PATENT DOCUMENTS

| | | |
|---|---|---|
| JP | 5-171415 | 7/1993 |
| JP | 09-031633 | 2/1997 |
| JP | 10-158820 | 6/1998 |
| JP | 2009-152189 | 7/2009 |

OTHER PUBLICATIONS

International Search Report issued in International Patent Application No. PCT/JP2011/003083, mailed on Aug. 30, 2011.

Office Action issued in corresponding U.S. Appl. No. 13/390,633, dated Jan. 15, 2014.

Final Office Action issued in corresponding U.S. Appl. No. 13/390,633, dated Apr. 15, 2014.

Chinese Office Action issued in Application No. 201180003592.7 dated Mar. 27, 2014.

* cited by examiner

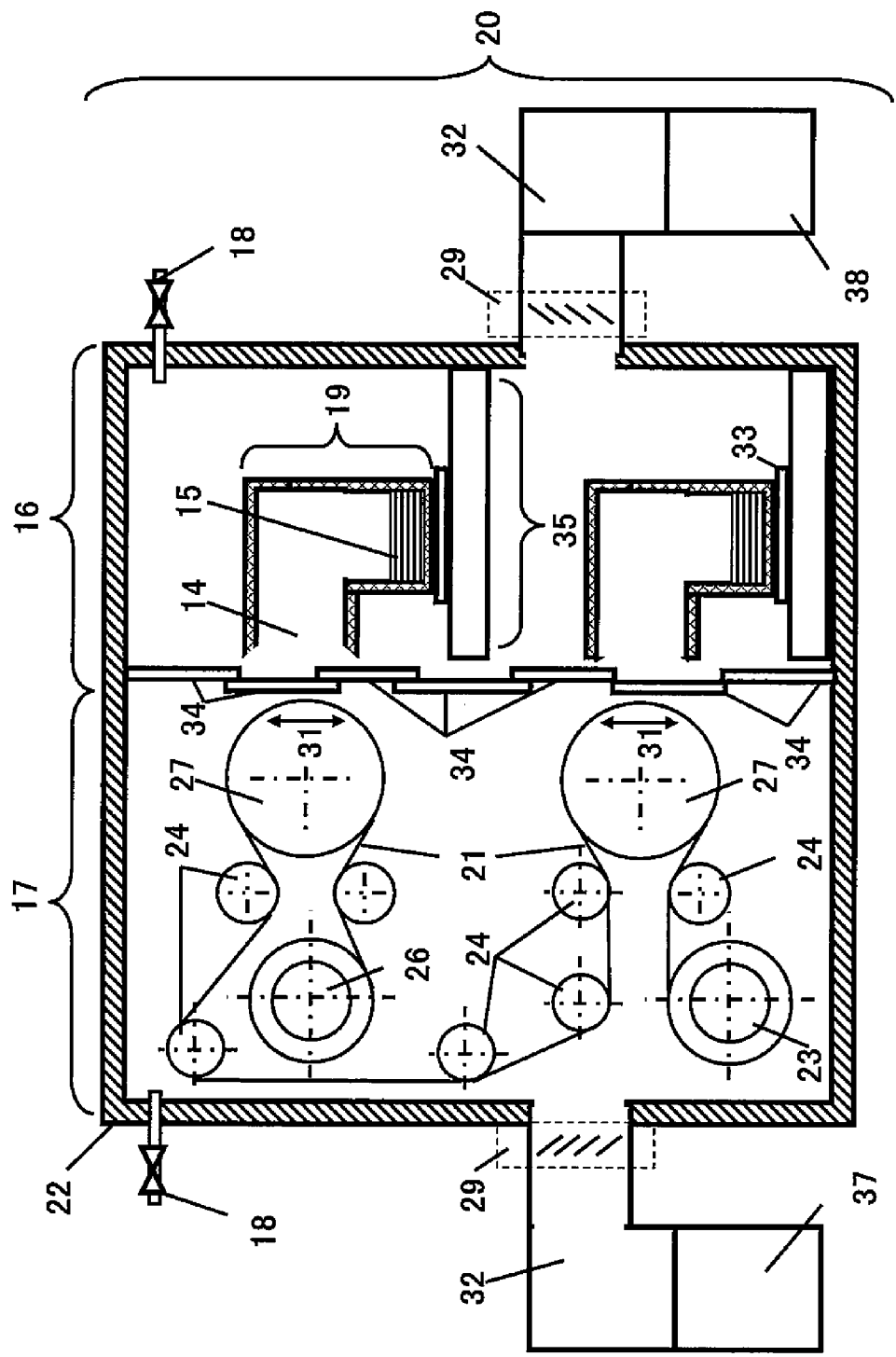
Fig. 6 (4)

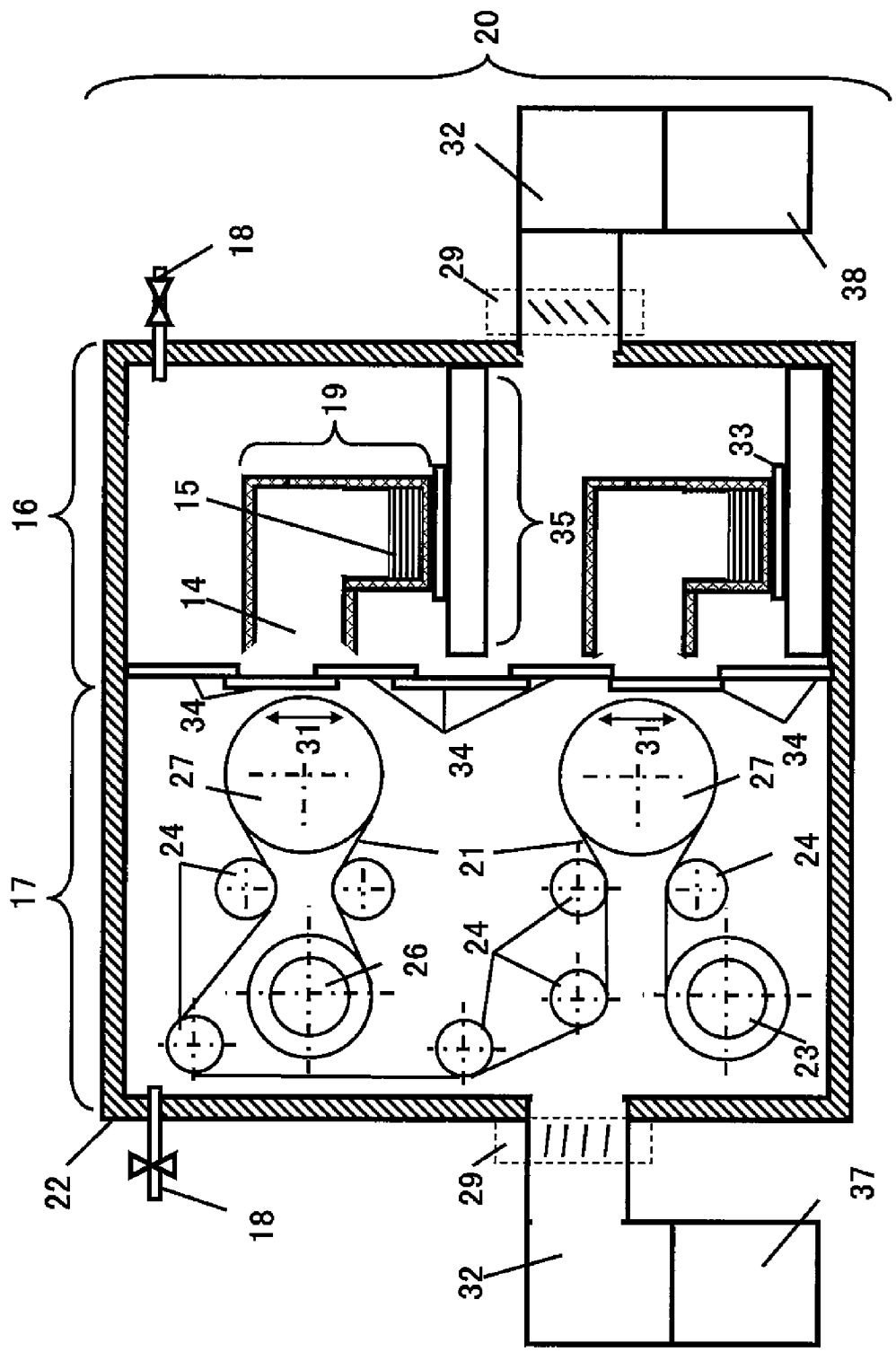
Fig. 6 (5)

METHOD OF MANUFACTURING THIN FILM WHICH SUPPRESSES UNNECESSARY SCATTERING AND DEPOSITION OF A SOURCE MATERIAL

RELATED APPLICATIONS

This application is the U.S. National Phase under 35 U.S.C. §371 of International Application No. PCT/JP2011/003083, filed on Jun. 1, 2011, which in turn claims the benefit of Japanese Application No. 2010-137223, filed on Jun. 16, 2010, the disclosures of which Applications are incorporated by reference herein.

TECHNICAL FIELD

The present invention relates to a method of manufacturing a thin film.

BACKGROUND ART

A thin film technology has been widely utilized for the purpose of the reduction in device sizes and the increase in device performances. There are various film formation methods used for the manufacture of the thin film. Examples are a deposition method, sputtering, ion plating, CVD, and laser ablation. These methods are used depending on the purpose. The deposition method comparatively excels in productivity. In the deposition method, resistance heating, induction heating, electron beam heating, or the like is used as a method of applying energy for heating and evaporating a film formation material.

One problem of the deposition method is the use efficiency of the film formation material. To be specific, from the standpoint of manufacturing cost, it is important to efficiently precipitate and deposit the evaporated, scattering film formation material on a substrate. To solve this problem, it is effective to use a nozzle-type evaporation source. In the case of using the nozzle-type evaporation source, the film formation material can be emitted from only an opening surface of a nozzle. Therefore, the scattering of the film formation material can be limited. By locating the opening surface and the substrate close to each other, the film formation material can further efficiently adhere to the substrate.

PTL 1 discloses that: in a device configured to form a synthetic resin coating film, open-close devices and evacuating devices are respectively provided for two raw material monomer evaporation source nozzles, and each of inner portions of evaporation source containers is maintained at a constant degree of vacuum regardless of the open or close state of the open-close devices. PTL 1 describes that with the above configuration, the synthetic resin coating films of the same quality are reproducibly, stably formed on the substrates.

PTL 2 discloses that in a method of manufacturing a negative electrode for a nonaqueous electrolyte secondary battery, lithium is supplied by a dry film formation method to a plurality of columnar bodies projecting from the surface of a current collector.

In the deposition method, the film formation material is heated to be adjusted such that the film formation material has, in vacuum, vapor pressure necessary for the film formation. With this, the film formation material is evaporated, and the film formation is performed. After predetermined film formation is completed, the film formation material may be cooled, and the pressure in a vacuum chamber is then returned to normal pressure. However, if the film formation material evaporates and scatters in the process of cooling the film formation material, material loss occurs. Therefore, it is important to prevent this loss from the standpoint of manufacturing cost.

PTL 3 discloses a method of performing deposition using an organic thin film material. According to PTL 3, in a state where the organic thin film material is accommodated in an evaporation source container, a vacuum pump is activated to evacuate the evaporation source container, and the organic thin film material is increased in temperature to generate the vapor of the organic thin film material. Then, an evaporation source shutter and substrate shutter provided above an emission opening of the evaporation source container are sequentially opened, and the formation of an organic thin film on the surface of a film formation target object provided in a vacuum chamber is started. When a predetermined film thickness is obtained, the substrate shutter and the evaporation source shutter are closed, and the heating of the thin film material is stopped. Thus, the deposition is terminated. Next, the thin film material is cooled in a state where an inert gas is supplied to the vacuum chamber to suppress the generation of the vapor. According to the method described in PTL 3, since the generation of the vapor of the organic thin film material is suppressed under an inert gas atmosphere, the organic thin film material can be effectively utilized. PTL 3 describes that since the inert gas serves as a heat medium, the cooling rate of the thin film material increases after the film formation.

CITATION LIST

Patent Literature

PTL 1: Japanese Laid-Open Patent Application Publication No. 5-171415

PTL 2: Japanese Laid-Open Patent Application Publication No. 2009-152189

PTL 3: Japanese Laid-Open Patent Application Publication No. 10-158820

SUMMARY OF INVENTION

Technical Problem

To improve the use efficiency of the film formation material in the deposition method, it is effective to perform the film formation in a state where the nozzle-type evaporation source is located close to the substrate. However, according to this method, since the distance between the evaporation source and the substrate is extremely short, a movable shielding member (shutter) cannot be provided between the evaporation source and the substrate. In a state where the shielding member is not provided between the evaporation source and the substrate, the film formation material evaporated after the completion of the predetermined film formation is unnecessarily deposited on the substrate. This leads to the material loss, and such material loss is problematic from the viewpoint of the use efficiency of the material.

According to the method described in PTL 3, the shutters are closed after the completion of the predetermined film formation, and the film formation material is then cooled while introducing the inert gas to the evaporation source container to suppress the generation of the vapor of the material. Therefore, the material loss in the cooling process can be avoided to some extent. However, according to this method, since the vapor of the material is being generated when closing the shutters, the material is deposited on the closed shutters, and this causes the problem of the material loss.

An object of the present invention is to provide a thin film manufacturing method capable of solving the above problems and realizing stable, highly-efficient film formation using a nozzle-type evaporation source while avoiding unnecessary scattering and deposition of the film formation material after the completion of the film formation.

Solution to Problem

In order to solve the above problems, a thin film manufacturing method of the present invention is a method of manufacturing a thin film in a film forming apparatus, the film forming apparatus including: an evaporation chamber; a film forming chamber which is provided adjacent to the evaporation chamber and in which a substrate is provided; vacuum pumps respectively connected to the evaporation chamber and the film forming chamber; a nonreactive gas introduction mechanism connected to one or both of the evaporation chamber and the film forming chamber; an evaporation source provided in the evaporation chamber, holding a film formation material, and having a semi-sealed structure including an opening surface; a moving mechanism configured to cause the evaporation source to move such that the opening surface is able to be located close to the substrate; and a conductance variable structure provided between the evaporation chamber and the film forming chamber, the method including: a first step of performing film formation on the substrate in a state where the opening surface of the evaporation source holding the heated film formation material is located close to the substrate while evacuating the evaporation chamber and the film forming chamber without shutting off communication between the evaporation chamber and the film forming chamber by the conductance variable structure; a second step of suppressing evaporation of the film formation material by introducing a nonreactive gas to the evaporation chamber and the film forming chamber to adjust pressure in each of the evaporation chamber and the film forming chamber to a predetermined pressure or more while maintaining a state where the communication between the evaporation chamber and the film forming chamber is not shut off; a third step of securing a space necessary for shutting off the communication between the evaporation chamber and the film forming chamber by causing the evaporation source to move by the moving mechanism such that the opening surface is located away from the substrate; a fourth step of activating the conductance variable structure to shut off the communication between the evaporation chamber and the film forming chamber; and a fifth step of cooling the film formation material while continuously introducing the nonreactive gas to the evaporation chamber.

With this configuration, the scattering of the film formation material can be suppressed immediately after the completion of the predetermined film formation. Therefore, the material loss can be significantly reduced.

In the present invention, it is preferable that the predetermined pressure be twice or more as high as vapor pressure of the film formation material heated in the first step. With this, the evaporation of the film formation material can be surely suppressed.

In the present invention, it is preferable that in the second step to the fifth step, an amount of the nonreactive gas introduced to each of the evaporation chamber and the film forming chamber be decreased in accordance with temperature decrease of the film formation material in the evaporation source. With this, the evaporation of the film formation material can be suppressed without introducing an unnecessary amount of nonreactive gas.

In the present invention, it is preferable that the second step to the fifth step be performed while evacuating the evaporation chamber and the film forming chamber at an evacuating rate lower than an evacuating rate in the first step. With this, when introducing the nonreactive gas, the pressure in each chamber can be easily adjusted to the predetermined pressure or more.

Advantageous Effects of Invention

According to the thin film manufacturing method of the present invention, the film formation can be performed in a state where the substrate and the evaporation source are located close to each other. Therefore, the use efficiency of the film formation material can be improved. In addition, the evaporation and scattering of the film formation material can be suppressed immediately after the completion of the predetermined film formation. Therefore, in the process of cooling the film formation material, the film formation material can be prevented from being unnecessarily deposited on the substrate and the members in the film forming apparatus. Thus, the loss of the film formation material can be prevented.

BRIEF DESCRIPTION OF DRAWINGS

FIG. 5(2) is a diagram schematically showing Embodiment 1 (second step) of the thin film manufacturing method of the present invention.

FIG. 5(3) is a diagram schematically showing Embodiment 1 (third step) of the thin film manufacturing method of the present invention.

FIG. 5(4) is a diagram schematically showing Embodiment 1 (fourth step) of the thin film manufacturing method of the present invention.

FIG. 5(5) is a diagram schematically showing Embodiment 1 (fifth step) of the thin film manufacturing method of the present invention.

FIG. 6(2) is a diagram schematically showing Embodiment 2 (second step) of the thin film manufacturing method of the present invention.

FIG. 6(3) is a diagram schematically showing Embodiment 2 (third step) of the thin film manufacturing method of the present invention.

FIG. 6(4) is a diagram schematically showing Embodiment 2 (fourth step) of the thin film manufacturing method of the present invention.

FIG. 6(5) is a diagram schematically showing Embodiment 2 (fifth step) of the thin film manufacturing method of the present invention.

DESCRIPTION OF EMBODIMENTS

Hereinafter, embodiments of the present invention will be explained in reference to the drawings.

Figure 1A:
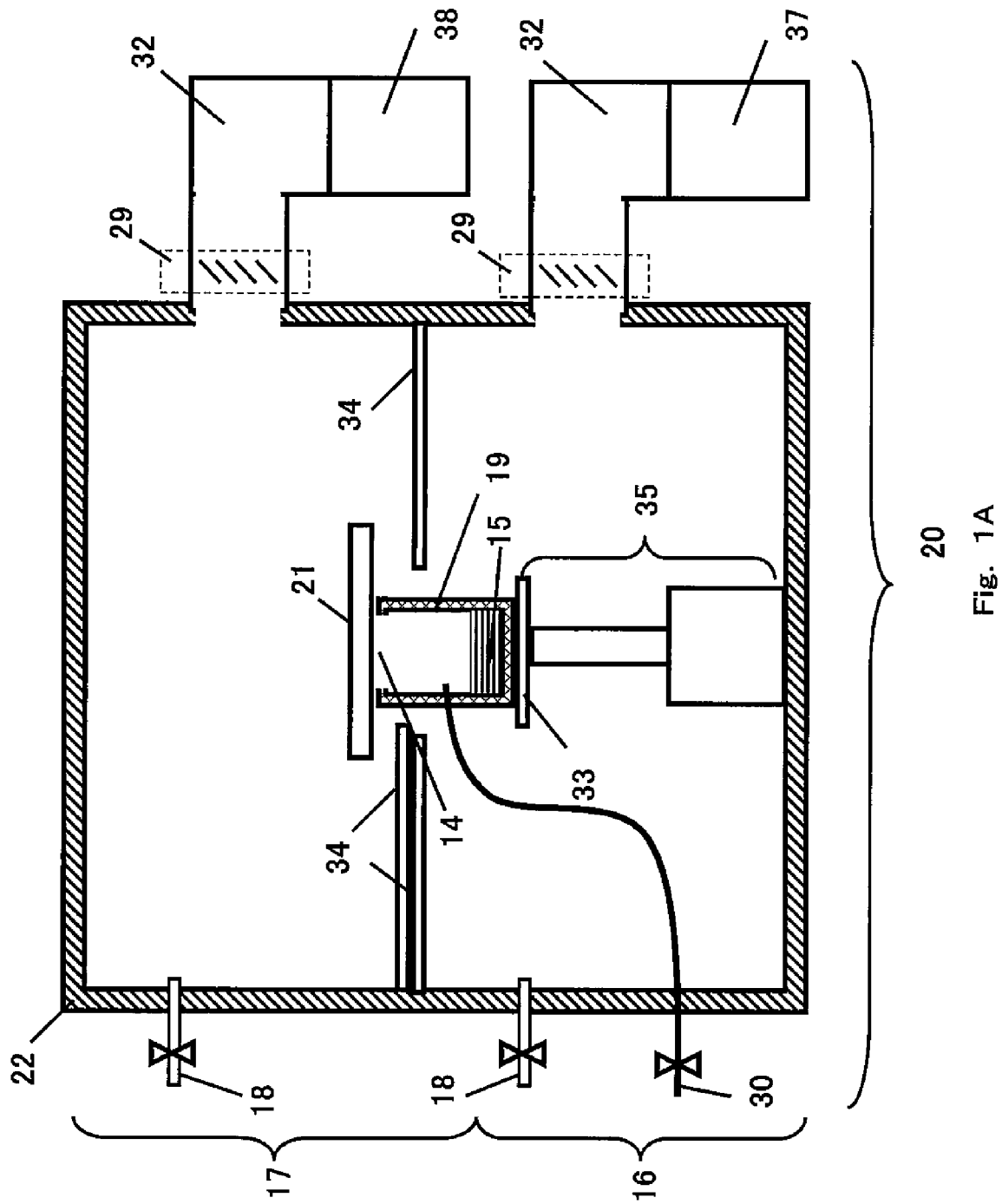
FIG. 1A is a diagram schematically showing one example of a device (during film formation) used in a thin film manufacturing method of the present invention.
Figure 1B:
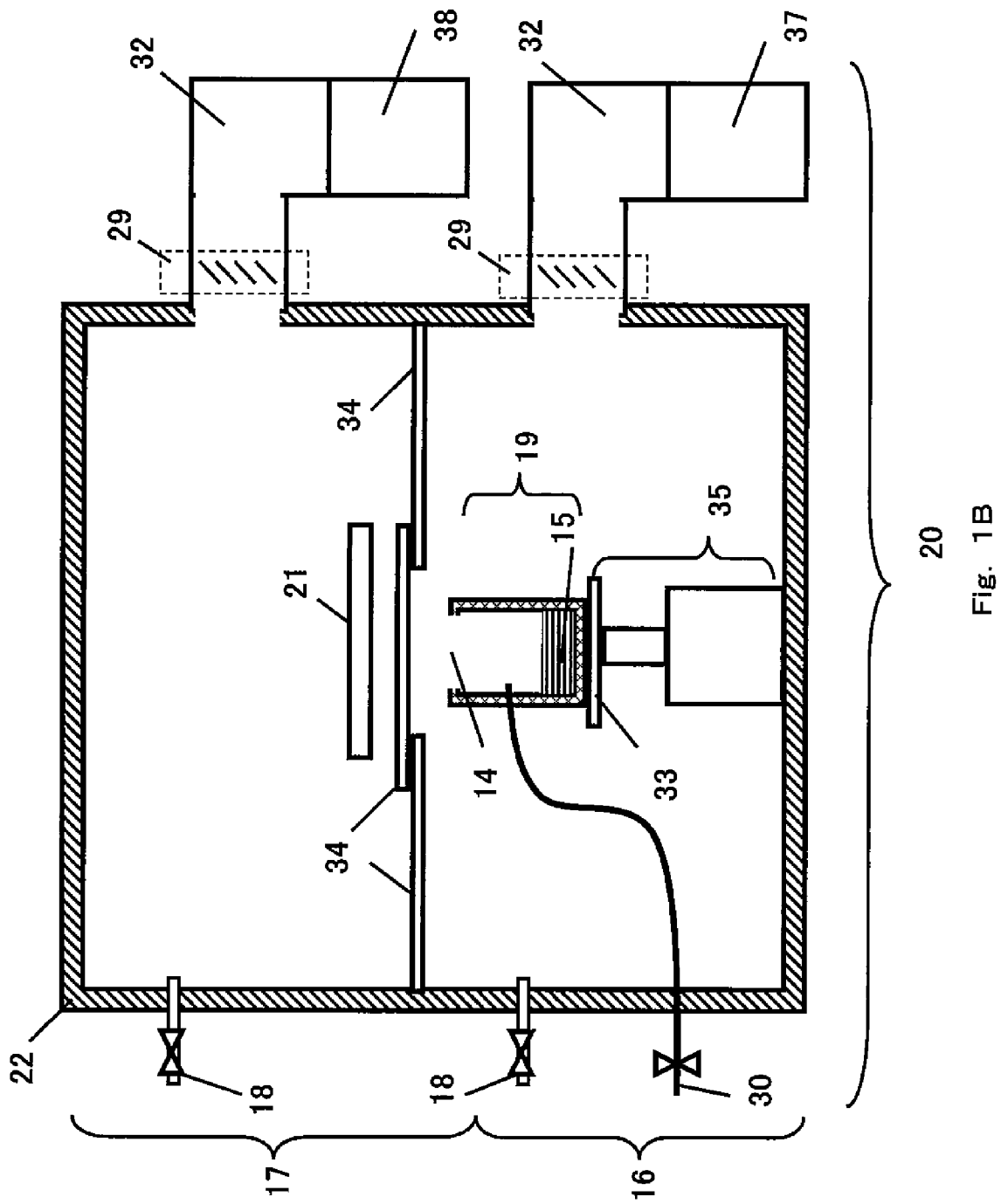
FIG. 1B is a diagram schematically showing one example of the device (after the completion of the film formation; a fourth step) used in the thin film manufacturing method of the present invention.

A thin film manufacturing method of the present invention can be performed by using a film forming apparatus schematically shown in FIGS. 1A and 1B and described below. FIG. 1A is a diagram schematically showing the film forming apparatus which is performing the film formation. FIG. 1B is a diagram schematically showing the film forming apparatus which has completed the film formation.

A film forming apparatus 20 includes a vacuum chamber 22. During the preparation of the film formation, the vacuum chamber 22 is divided into an evaporation chamber 16 and a film forming chamber 17 provided adjacent to the evaporation chamber 16. An evaporation source 19 is provided in the evaporation chamber 16, and a substrate 21 is provided in the film forming chamber 17. Vacuum pumps 37 and 38 are respectively connected to the evaporation chamber 16 and the film forming chamber 17 to evacuate respective chambers. Nonreactive gas introduction mechanisms 18 are respectively connected to the evaporation chamber 16 and the film forming chamber 17 to introduce a nonreactive gas to respective chambers. The evaporation source 19 is provided in the evaporation chamber 16. The evaporation source 19 holds a film formation material 15, has a semi-sealed structure including an opening surface 14, and is heatable. The substrate 21 that is a film formation target object is provided in the film forming chamber 17. The evaporation source 19 is provided so as to be movable by a moving mechanism 35. With this, the opening surface 14 of the evaporation source 19 can be moved close to the substrate 21 as shown in FIG. 1A and can be moved away from the substrate 21 as shown in FIG. 1B. A conductance variable structure 34 is provided between the evaporation chamber 16 and the film forming chamber 17. The evaporation chamber 16 and the film forming chamber 17 are divided by this conductance variable structure 34. By moving the conductance variable structure 34, spatial continuity between the film forming chamber 17 and the evaporation chamber 16 is completely or substantially shut off, so that differential pressure between these chambers is secured, or the spatial continuity between these chambers is kept, so that the pressure is the same between these chambers.

The vacuum chamber 22 constituting the evaporation chamber and the film forming chamber is a pressure-resistant metal container. The vacuum pumps 37 and 38 are connected to the vacuum chamber 22 via vacuum valves (not shown). Various vacuum pumps can be used as the vacuum pumps 37 and 38. Generally, each of the vacuum pumps 37 and 38 is constituted by a main pump and an auxiliary pump, such as an oil-sealed rotary pump. An oil diffusion pump, a cryopump, or a turbo-molecular pump is preferably used as the main pump. It is desirable to provide main valves 32 each configured to open and close the main pump. It is also desirable that conductance valves 29 each configured to adjust an evacuating rate be respectively provided between the main pump and the evaporation chamber and between the main pump and the film forming chamber.

The nonreactive gas introduction mechanisms 18 are respectively connected to the evaporation chamber 16 and the film forming chamber 17 and introduce the nonreactive gas to respective chambers. In FIG. 1, the nonreactive gas introduction mechanisms 18 are respectively connected to the evaporation chamber 16 and the film forming chamber 17. However, the present invention is not limited to this. The nonreactive gas introduction mechanism 18 may be connected to only one of the evaporation chamber 16 and the film forming chamber 17. For example, the nonreactive gas introduction mechanism 18 is constituted by: a gas source (not shown), such as a gas bomb; a flow rate controller (not shown) connected to the gas source through a pipe; a pipe extending between a vacuum chamber and the flow rate controller; and a gas valve configured to select gas introduction or gas shut-off. A mass flow controller or the like is used as the flow rate controller.

Figure 6:
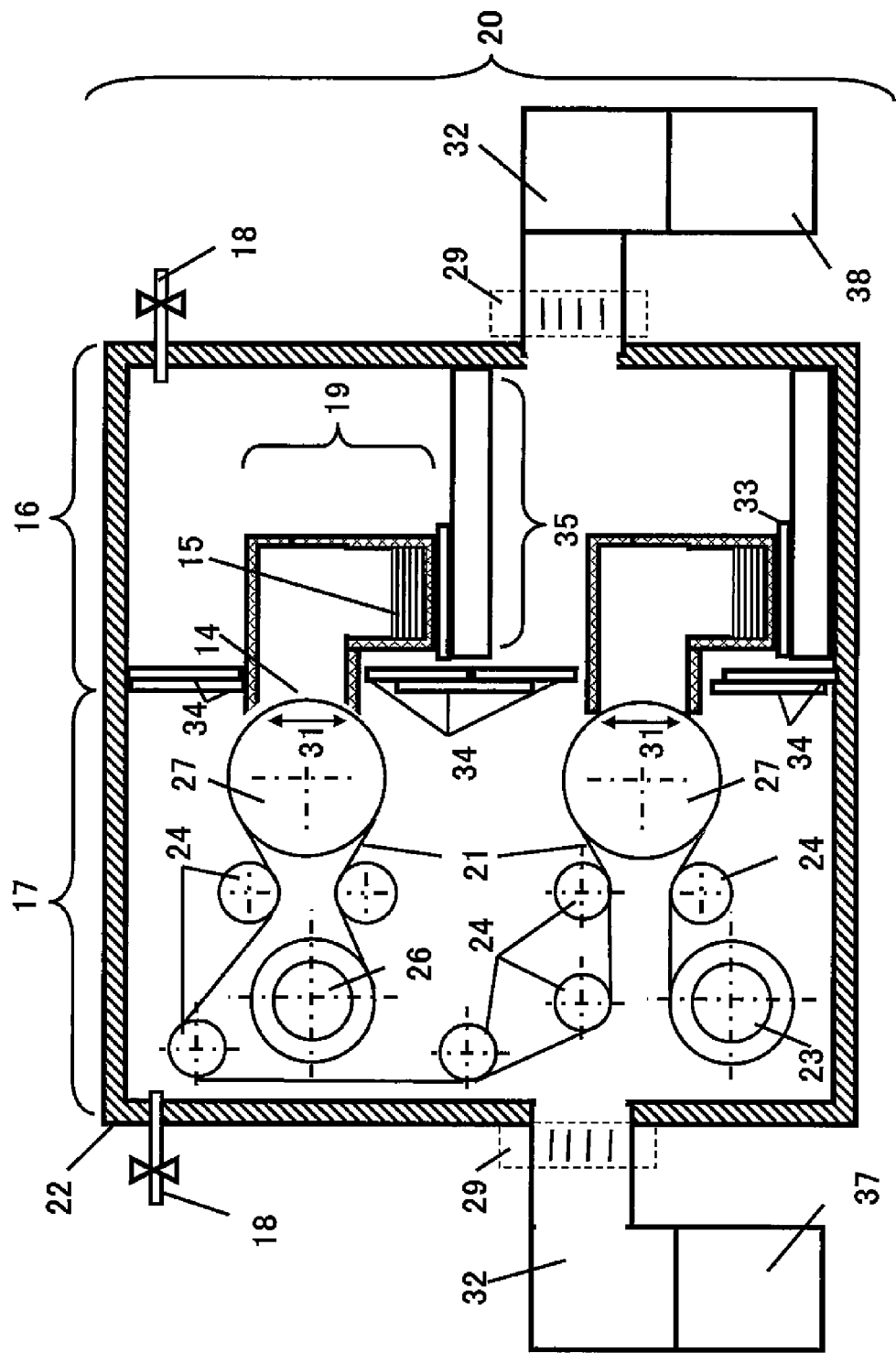
FIG. 6(1) is a diagram schematically showing Embodiment 2 (first step) of the thin film manufacturing method of the present invention.
Figure 6:
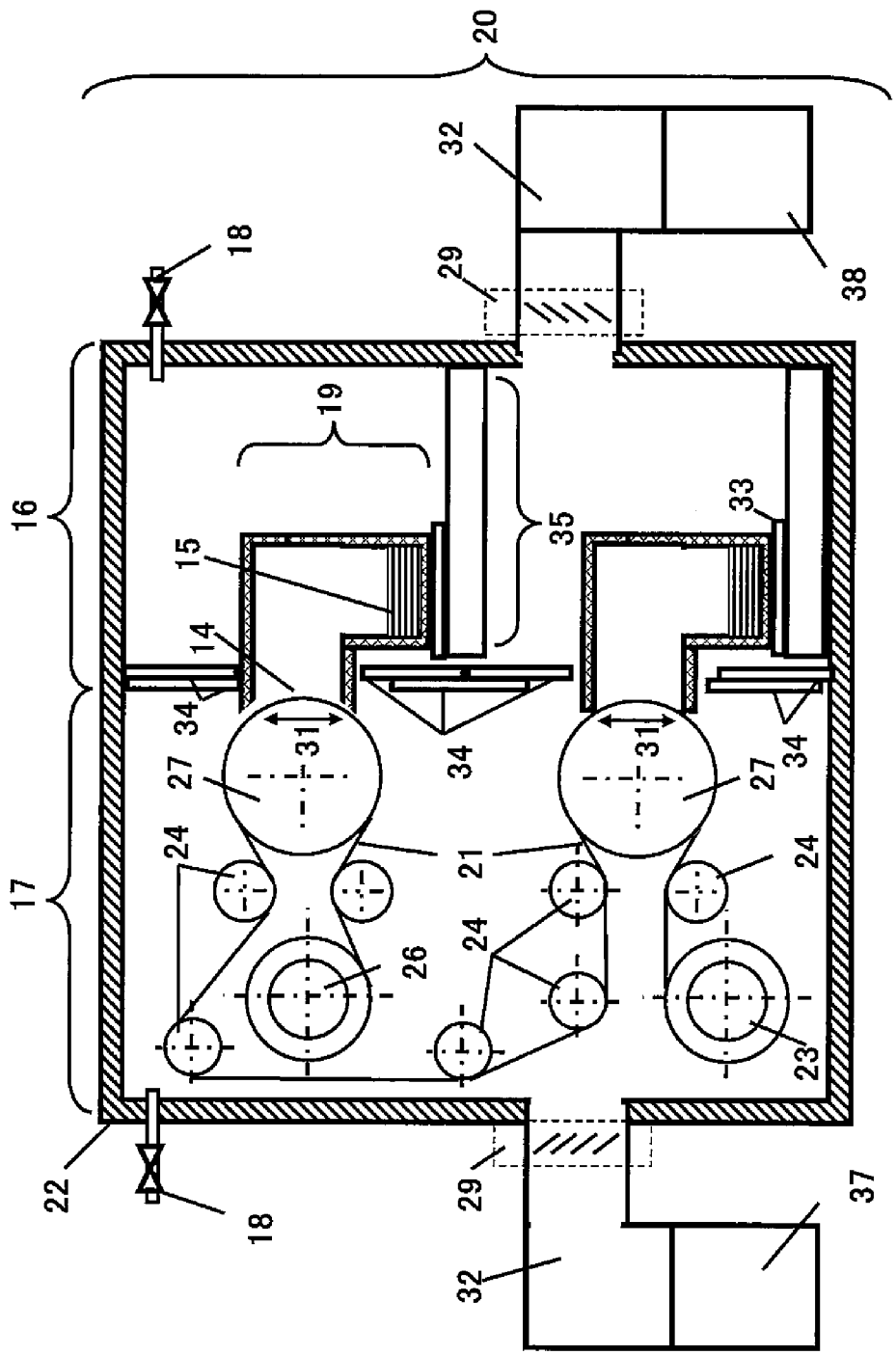
Figure 6:
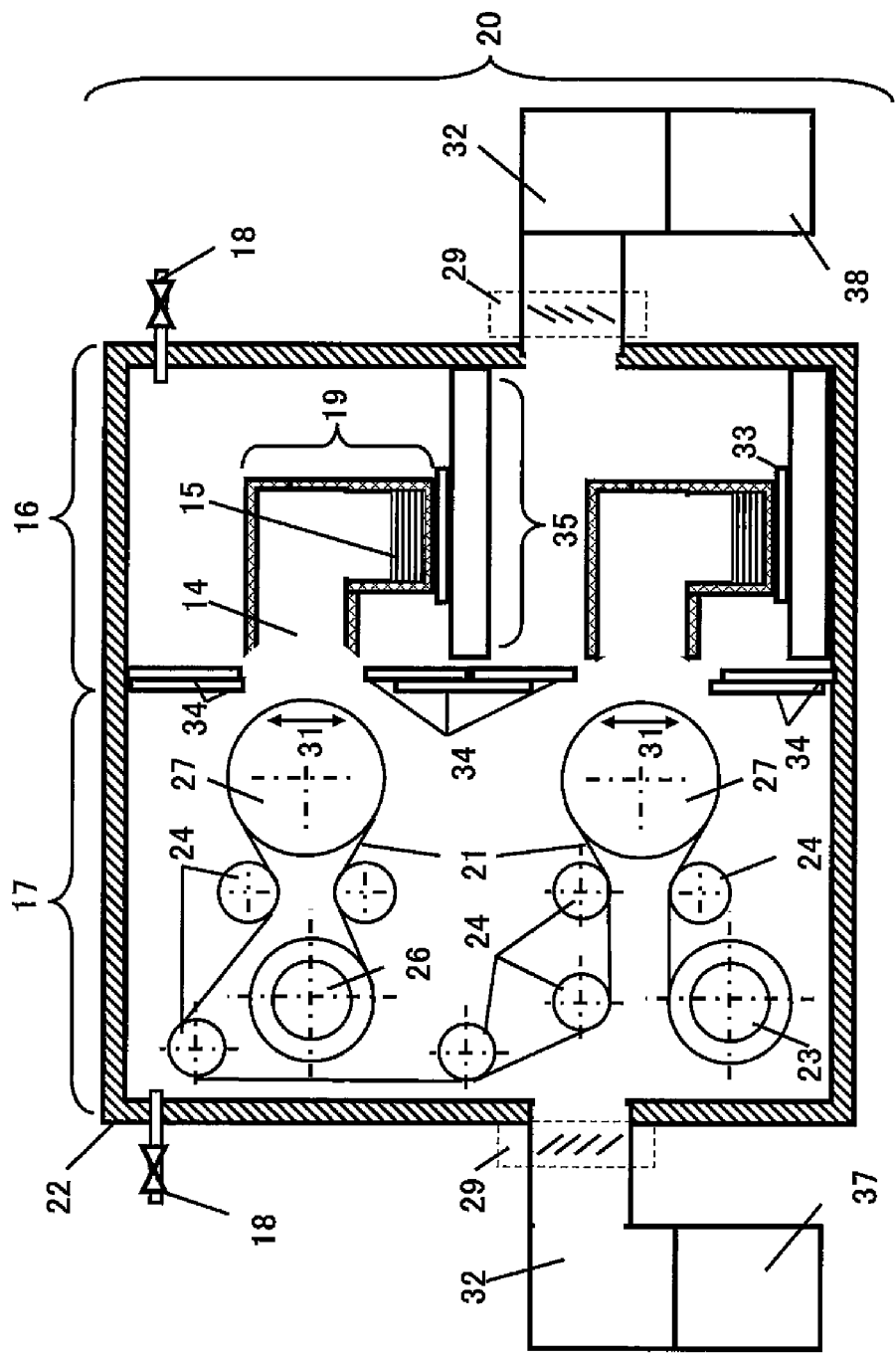

The evaporation source 19 having the semi-sealed structure accommodates the film formation material 15 and has the opening surface 14 which allows the evaporation and scattering of the evaporated material. For example, the shape of the evaporation source may be a columnar shape having an opening on its upper surface or a rectangular solid shape having an opening on its upper surface. By locating the opening, formed on an upper portion of the evaporation source, close to the substrate, the vapor of the film formation material does not scatter to the environment and is deposited only on the substrate 21. Therefore, the film formation material can be efficiently utilized. However, the opening does not have to face upward. For example, as shown in FIGS. 6(1) to 6(5), the evaporation source having the opening on its side surface can also be used. In this case, the substrate is provided vertically. For example, a metal material, a carbon material, or a refractory material, which is low-reactive with the film formation material, is used as a material constituting the evaporation source. According to need, the evaporation source may be constituted by the combination of these materials. As shown in FIG. 1B, the entire evaporation source 19 is located in the evaporation chamber 16 after the completion of the film formation. However, as shown in FIG. 1A, during the film formation, at least the opening surface 14 of the evaporation source 19 projects into the film forming chamber 17 to be located close to the substrate 21.

As shown in FIG. 1, the moving mechanism 35 is a lifting mechanism including a stage 33 on which, for example, the evaporation source 19 is mounted. The lifting mechanism can be constituted by, for example, an oil-pressure cylinder, a ball screw, and a gear. By moving up or down the stage by the lifting mechanism, the opening surface 14 formed at the upper portion of the evaporation source 19 can be moved close to or away from the substrate provided above the evaporation source. However, the moving mechanism is not limited to this. For example, the moving mechanism may be configured so as to cause the evaporation source, including the opening on its side surface, to move in a horizontal direction, or the moving mechanism may be configured so as to cause the opening to move close to or away from the substrate by the combination of a vertical or horizontal straight movement and a rotational movement.

Figure 3A:
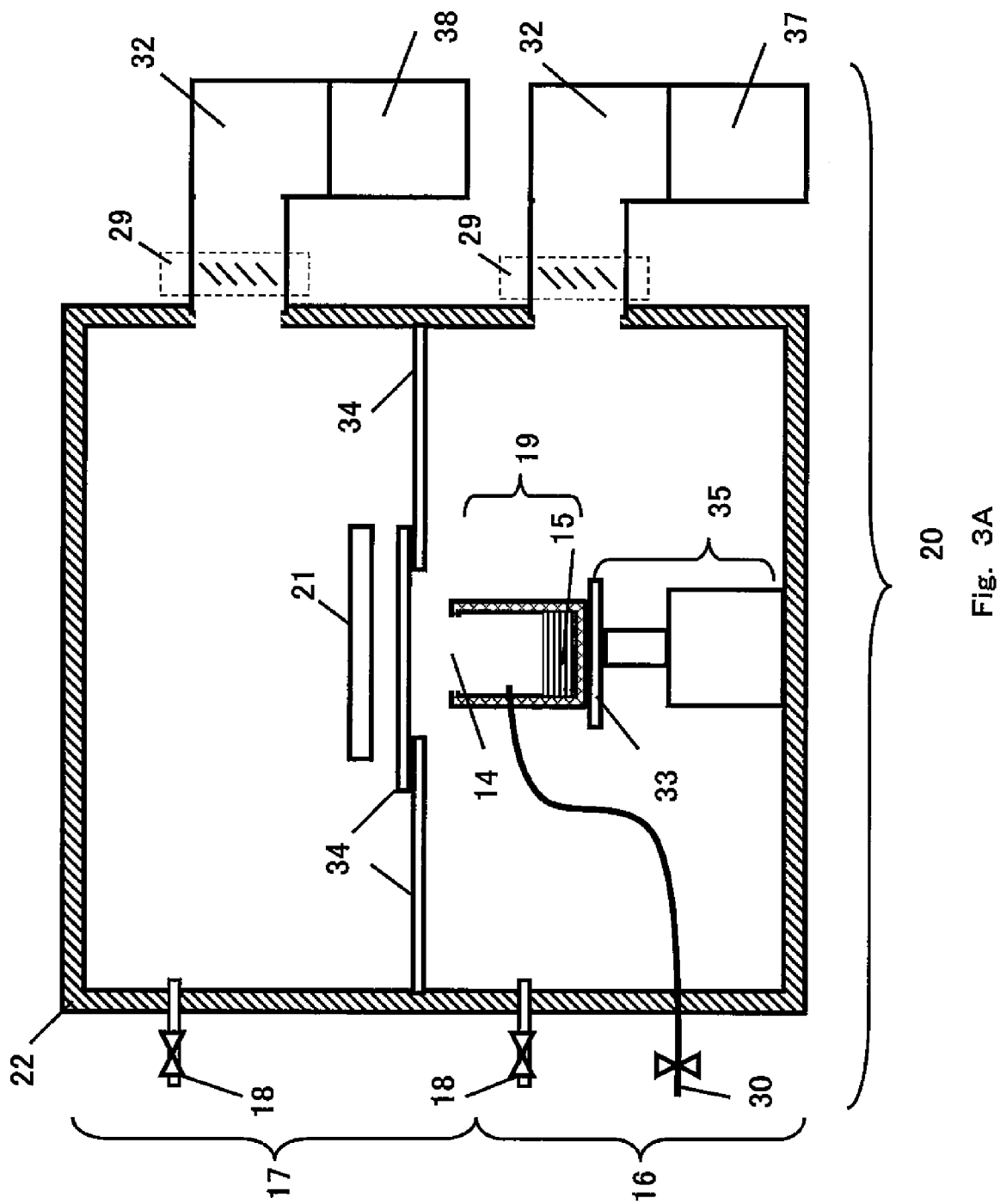
FIG. 3A is a diagram schematically showing one example of a conductance variable structure (when differential pressure is secured).
Figure 3B:
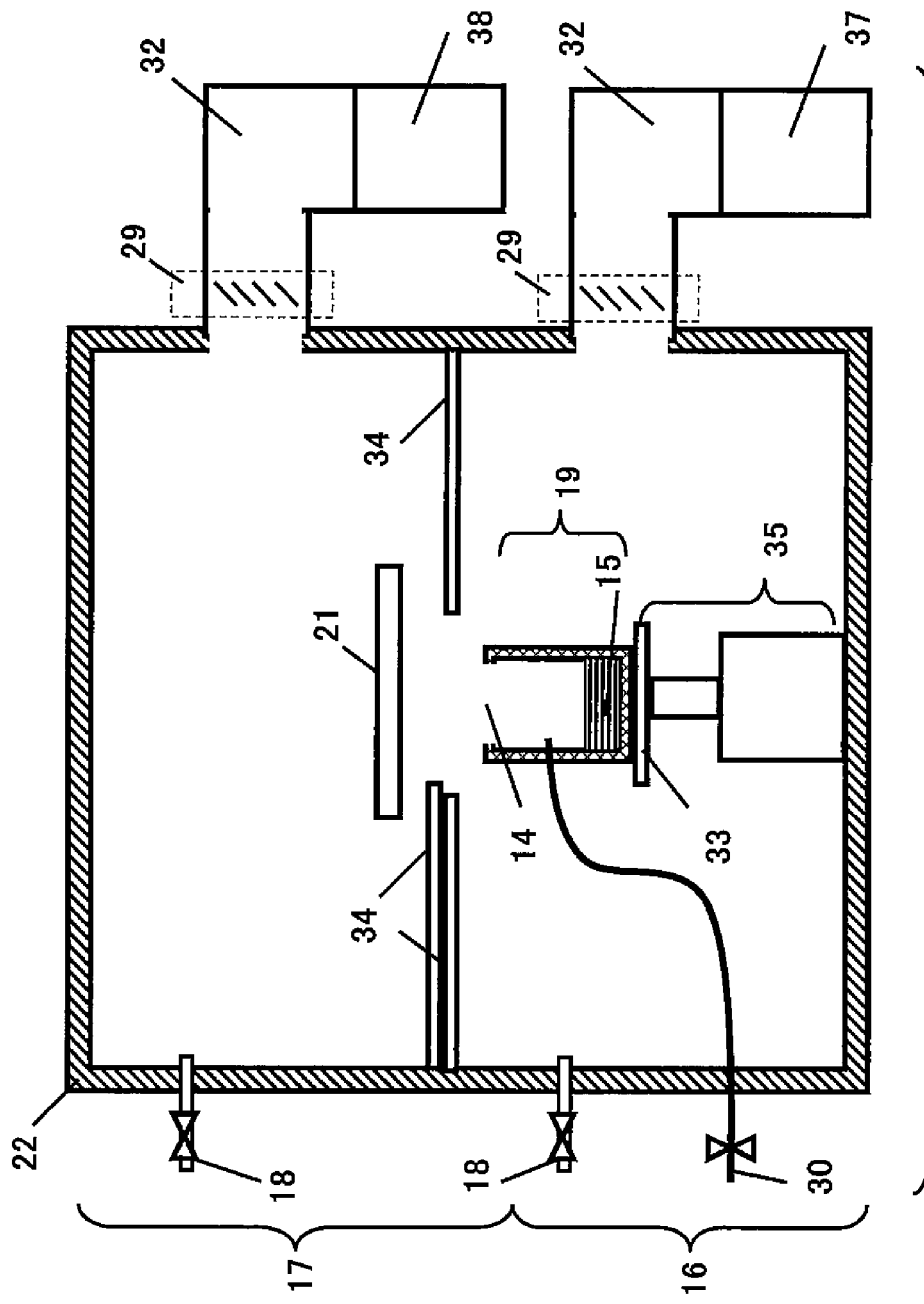
FIG. 3B is a diagram schematically showing one example of the conductance variable structure (when the differential pressure is canceled).
Figure 4A:
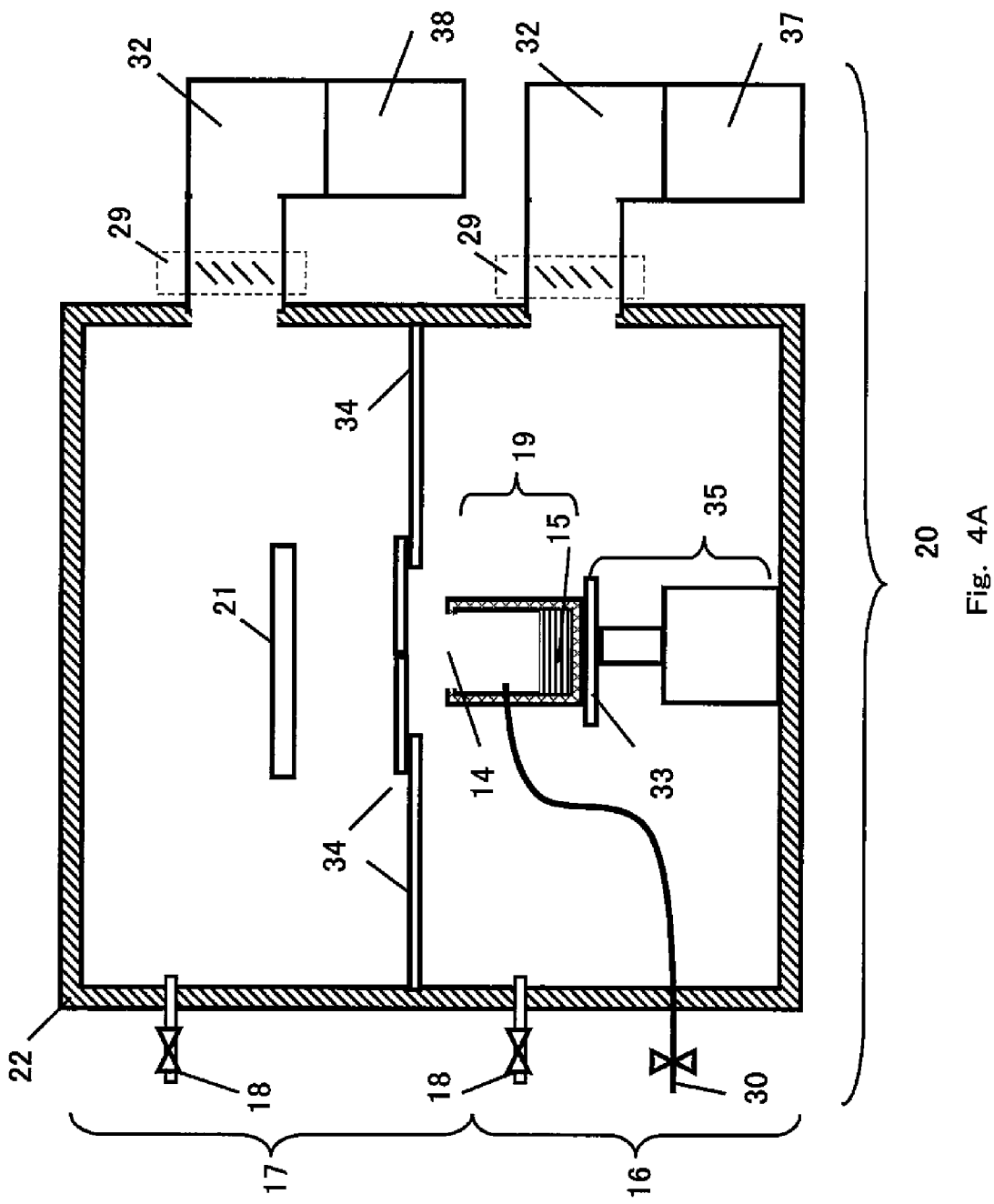
FIG. 4A is a diagram schematically showing another example of the conductance variable structure (when the differential pressure is secured).
Figure 4B:
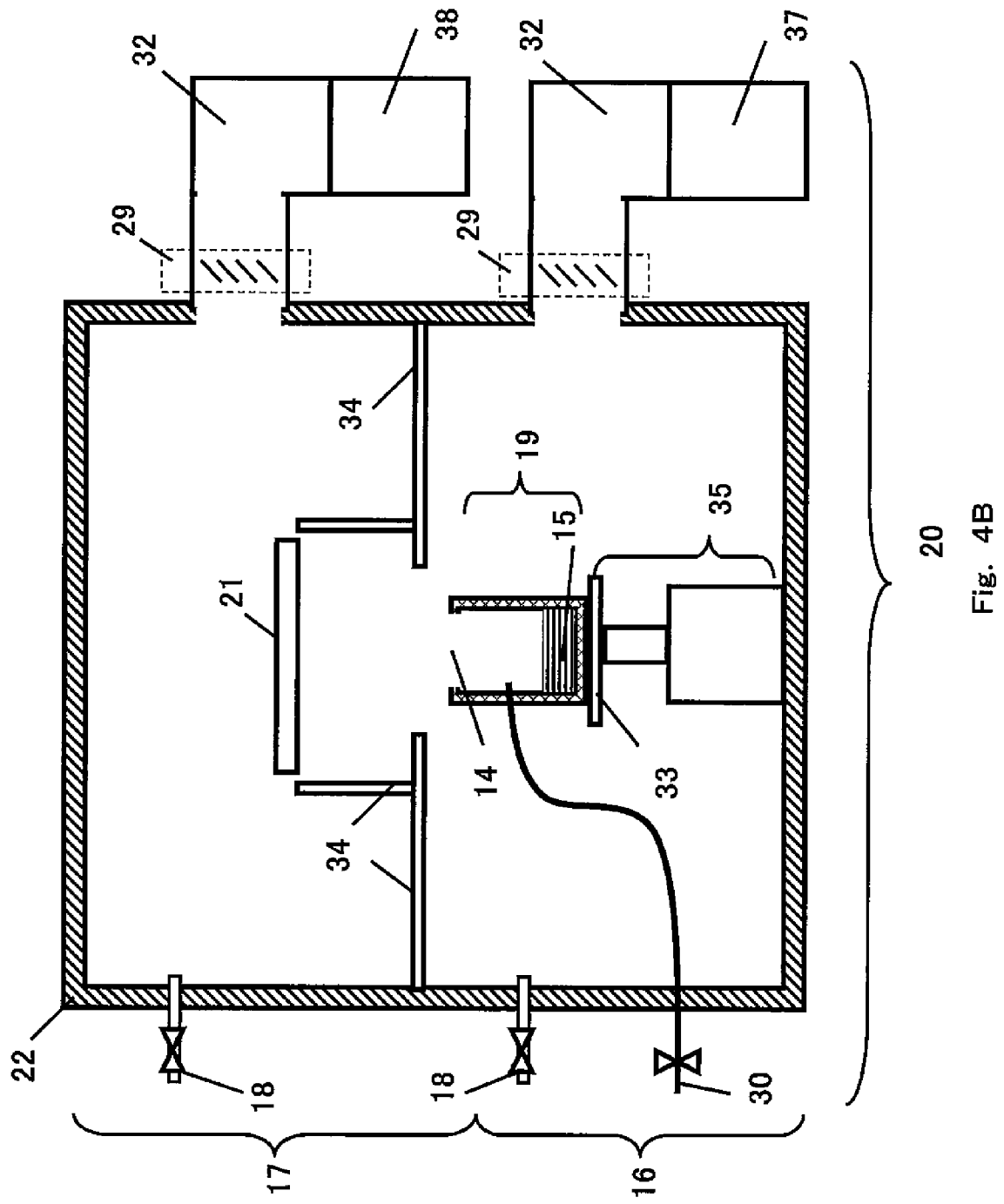
FIG. 4B is a diagram schematically showing another example of the conductance variable structure (when the differential pressure is canceled).

The conductance variable structure 34 is provided at a boundary between the evaporation chamber 16 and the film forming chamber 17. By activating the conductance variable structure 34, the differential pressure can be secured between the evaporation chamber 16 and the film forming chamber 17, or the pressure can be equalized between these chambers. The conductance variable structure is, for example, a plate-shaped movable dividing wall. By completely or substantially shutting off a communication passage between the evaporation chamber 16 and the film forming chamber 17, a communication state between the evaporation chamber and the film forming chamber can be shut off, and the differential pressure between these chambers can be secured. In addition, by partially or entirely moving the movable dividing wall to form the communication passage between the evaporation chamber and the film forming chamber, the communication state between these chambers can be enlarged, and the pressure can be substantially equalized between these chambers. FIGS. 3A, 3B, 4A, and 4B schematically show operation examples of the conductance variable structure. FIGS. 3A and 3B show a slide type movable dividing wall, and FIGS. 4A and 4B show a double-door type movable dividing wall. Each of FIGS. 3A and 4A shows a state where the communication passage is shut off and the differential pressure is secured (differential pressure structure). Each of FIGS. 3B and 4B shows a state where the communication passage is formed and the differential pressure structure is canceled. In a case where a small amount of vapor is generated during the cooling of the evaporation source, the prevention of the deposition can be performed by a member constituting the conductance variable structure. However, a shutter mechanism for the mild prevention of deposition may be additionally provided between the conductance variable structure and the evaporation source.

In a state where the conductance variable structure forms the communication passage (FIGS. 3B and 4B), the opening surface 14 of the evaporation source 19 is provided under the communication passage, and the substrate 21 is provided above the communication passage. By moving up the evaporation source 19 by the moving mechanism 35 to cause the opening surface 14 to pass through the communication passage, the opening surface 14 can be located closer to the substrate 21. Therefore, it is preferable that the size of the communication passage formed by opening the conductance variable structure be such that the opening surface 14 of the evaporation source 19 can pass through the communication passage.

According to the thin film manufacturing method of the present invention, the thin film is manufactured in the film forming apparatus described above. The thin film manufacturing method of the present invention includes steps (a) to (e) below;

(a) a first step of performing film formation on the substrate in a state where the opening surface of the evaporation source holding the heated film formation material is located close to the substrate while evacuating the evaporation chamber and the film forming chamber without shutting off communication between the evaporation chamber and the film forming chamber by the conductance variable structure;

(b) a second step of suppressing evaporation of the film formation material by introducing a nonreactive gas to the evaporation chamber and the film forming chamber to adjust pressure in each of the evaporation chamber and the film forming chamber to a predetermined pressure or more while maintaining a state where the communication between the evaporation chamber and the film forming chamber is not shut off;

(c) a third step of securing a space necessary for shutting off the communication between the evaporation chamber and the film forming chamber by causing the evaporation source to move by the moving mechanism such that the opening surface is located away from the substrate;

(d) a fourth step of activating the conductance variable structure to shut off the communication between the evaporation chamber and the film forming chamber; and (e) a fifth step of cooling the film formation material while continuously introducing the nonreactive gas to the evaporation chamber.

Figure 7:
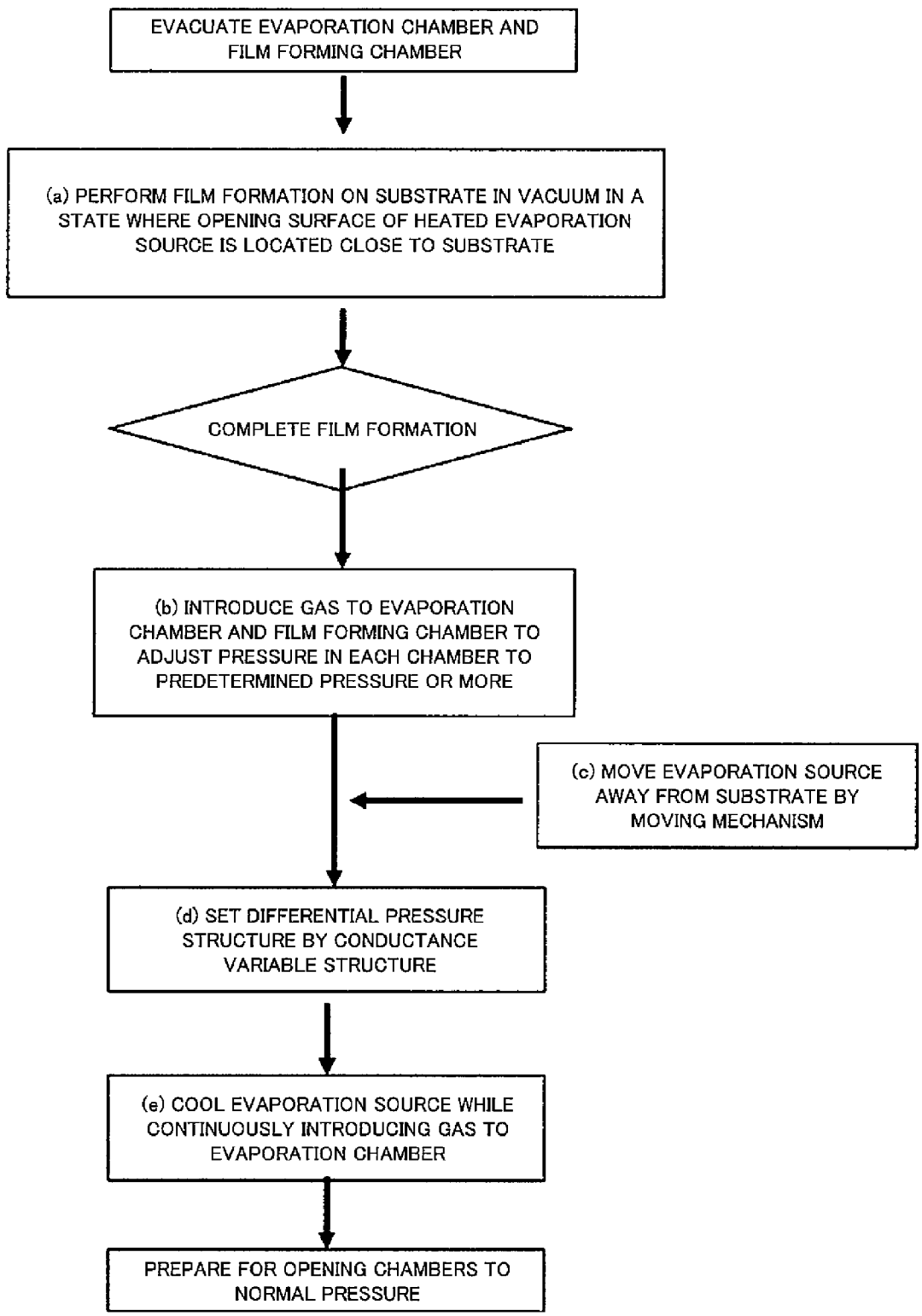
FIG. 7 is a flow chart for explaining the thin film manufacturing method of the present invention.

FIG. 7 shows a flow chart of the thin film manufacturing method of the present invention.

In the step (a) that is the first step, the film formation is performed. The film formation is performed after the substrate and the film formation material are provided at predetermined positions in the film forming apparatus.

The evaporation chamber and the film forming chamber are evacuated. The degree of vacuum is a degree necessary for the deposition and is, for example, 0.01 Pa or less, desirably 0.001 Pa or less, although it depends on the film formation material and a required film quality.

The evaporation source 19 provided in the evaporation chamber 16 holds the film formation material 15. The film formation material melts by heating and thus obtains significant vapor pressure (vapor pressure suitable for the film formation). As a method of heating the film formation material, it is preferable to use, for example, resistance heating or induction heating. In the case of the resistance heating, the evaporation source can be heated by, for example, winding a heater wire around the evaporation source. The evaporation source can be heated in such a manner that an outlet for a rod-shaped heater is formed on a wall surface of the evaporation source, and the rod-shaped heater is used. In the case of the induction heating, the evaporation source is heated by winding a coil around the evaporation source and applying high-frequency electric power to the coil.

In the first step, the differential pressure structure by the conductance variable structure is being canceled, and the communication passage between the film forming chamber and the evaporation chamber (the communication passage formed by the operation of the conductance variable structure) is being formed. The evaporation source is provided by the moving mechanism such that the opening surface 14 is located close to the substrate. Since the opening surface and the substrate are located close to each other, the vapor of the film formation material does not scatter to the environment, and the film formation can be performed efficiently. It is preferable that as shown in FIG. 1A, the upper portion of the evaporation source have passed through the communication passage. With this, the opening surface and the substrate can be located closer to each other.

Next, in the step (b) that is the second step, while maintaining the communication passage between the film forming chamber and the evaporation chamber and the position of the evaporation source, the nonreactive gas is introduced to the evaporation chamber and the film forming chamber against the vapor pressure of the heated film formation material in order to suppress the evaporation of the film formation material. By the introduction of the nonreactive gas, each of the pressure in the evaporation chamber and the pressure in the film forming chamber is adjusted to predetermined pressure or more. Here, adjusting the pressure to the predetermined pressure or more is preferably adjusting the pressure to pressure higher than the vapor pressure of the heated and melted film formation material and more preferably adjusting the pressure to pressure that is equal to or higher than twice the vapor pressure of the film formation material. In a case where the pressure of the nonreactive gas in each of the evaporation chamber and the film forming chamber exceeds the vapor pressure of the film formation material, the evaporation of the film formation material is suppressed. The film formation can be terminated by performing the second step when the predetermined film formation is completed in the first step. The type of the nonreactive gas used can be suitably selected for the purpose of avoiding the reaction with the melted film formation material. The nonreactive gas is desirably argon or neon.

In the second step, it is desirable that the pressure in the film forming chamber 17 be substantially equal to the pressure in the evaporation chamber 16 or be higher than the pressure in the evaporation chamber 16. It is more desirable that the pressure in the evaporation chamber and the pressure in the film forming chamber be substantially equal to each other. With this, the members and products in the film forming chamber can be prevented from being contaminated by the movement of the vapor of the film formation material from the evaporation chamber 16 to the film forming chamber 17.

The heating of the film formation material can be stopped at the same time when the evaporation of the film formation material is suppressed in the second step. However, the heating of the film formation material can also be stopped in or after the third step.

In the second step, the evaporation of the film formation material is suppressed by the introduction of the nonreactive gas while maintaining the communication passage between the film forming chamber and the evaporation chamber (to be specific, without interposing the shielding member, such as the shutter, between the substrate and the evaporation source). Thus, the film formation can be terminated without causing the loss of the film formation material and the contamination of the products and the members in the film forming apparatus by the evaporated film formation material. Therefore, the material loss caused at the time of the termination of the film formation can be avoided.

Next, in the step (c) that is the third step, the evaporation source is moved by the moving mechanism, so that the opening surface of the evaporation source is located away from the substrate. With this, a space into which the conductance variable structure can be inserted is formed between the opening surface of the evaporation source and the substrate. The evaporation source is moved such that for example, the evaporation source provided on the stage is lowered by lowering the stage connected to the oil-pressure cylinder, and thus the open surface formed on the upper portion of the evaporation source is located away from the substrate provided above the evaporation source. By the third step, preparation for activating the conductance variable structure to shut off the communication passage between the evaporation chamber and the film forming chamber can be completed. In the third step, the pressure in the vacuum chamber is maintained at predetermined pressure or more, and the evaporation of the film formation material in the evaporation source is being suppressed while the film formation material has the vapor pressure suitable for the film formation since the film formation material is not yet adequately cooled.

Next, in the step (d) that is the fourth step, a structure (differential pressure structure) capable of securing the differential pressure between the evaporation chamber and the film forming chamber is realized by activating the conductance variable structure to completely or substantially shut off the communication passage between the evaporation chamber and the film forming chamber. In a case where the differential pressure structure is realized by the plate-shaped movable dividing wall that is one example of the conductance variable structure, the differential pressure structure can be formed by shutting off the communication passage between the evaporation chamber and the film forming chamber by the movement of the movable dividing wall. The communication passage may be hermetically shut off. However, the communication passage does not have to be strictly, hermetically shut off. The communication passage may be shut off to a level that the pressure difference can be generated between the evaporation chamber and the film forming chamber by reducing the conductance between these chambers. Slight vapor of the film formation material from the evaporation source toward the substrate can be shut off by the conductance variable structure forming the differential pressure structure. By the fourth step, the pressure difference can be generated between the evaporation chamber and the film forming chamber, and the deposition of the film formation material on the substrate can be prevented. In the fourth step, the pressure in the vacuum chamber is maintained at predetermined pressure or more, and the evaporation of the film formation material in the evaporation source is being suppressed while the film formation material has the vapor pressure suitable for the film formation since the film formation material is not yet adequately cooled.

Next, in the step (e) that is the fifth step, the film formation material in the evaporation source is cooled while continuously introducing the nonreactive gas to the evaporation chamber. Until the temperature of the film formation material in the evaporation source adequately decreases up to a temperature at which the evaporation of the film formation material does not occur, the evaporation of the film formation material is continuously suppressed by continuously introducing the nonreactive gas to the evaporation chamber. With this, the material loss, which occurs during the cooling of the film formation material, can be avoided. As the temperature of the film formation material in the evaporation source decreases, the vapor pressure of the film formation material decreases. Therefore, even if the pressure of the nonreactive gas in the evaporation chamber is decreased in accordance with the temperature decrease, the evaporation of the film formation material can be suppressed. On this account, it is preferable that the amount of nonreactive gas introduced to the evaporation chamber in the fifth step be decreased in accordance with the temperature decrease of the film formation material. The film formation material in the evaporation source may be naturally cooled. However, the film formation material in the evaporation source can be forcedly cooled. Examples of the method of forcedly cooling the film formation material are a method of causing coolants to contact the evaporation source and a method of utilizing heat exchange realized by causing a gas or liquid to flow through a tube penetrating the evaporation source. After the film formation material is adequately cooled by the fifth step, it is possible to prepare for opening the evaporation chamber and the film forming chamber to normal pressure. The introduction of the nonreactive gas to the film forming chamber may be continued or terminated in the fifth step.

Figure 2:
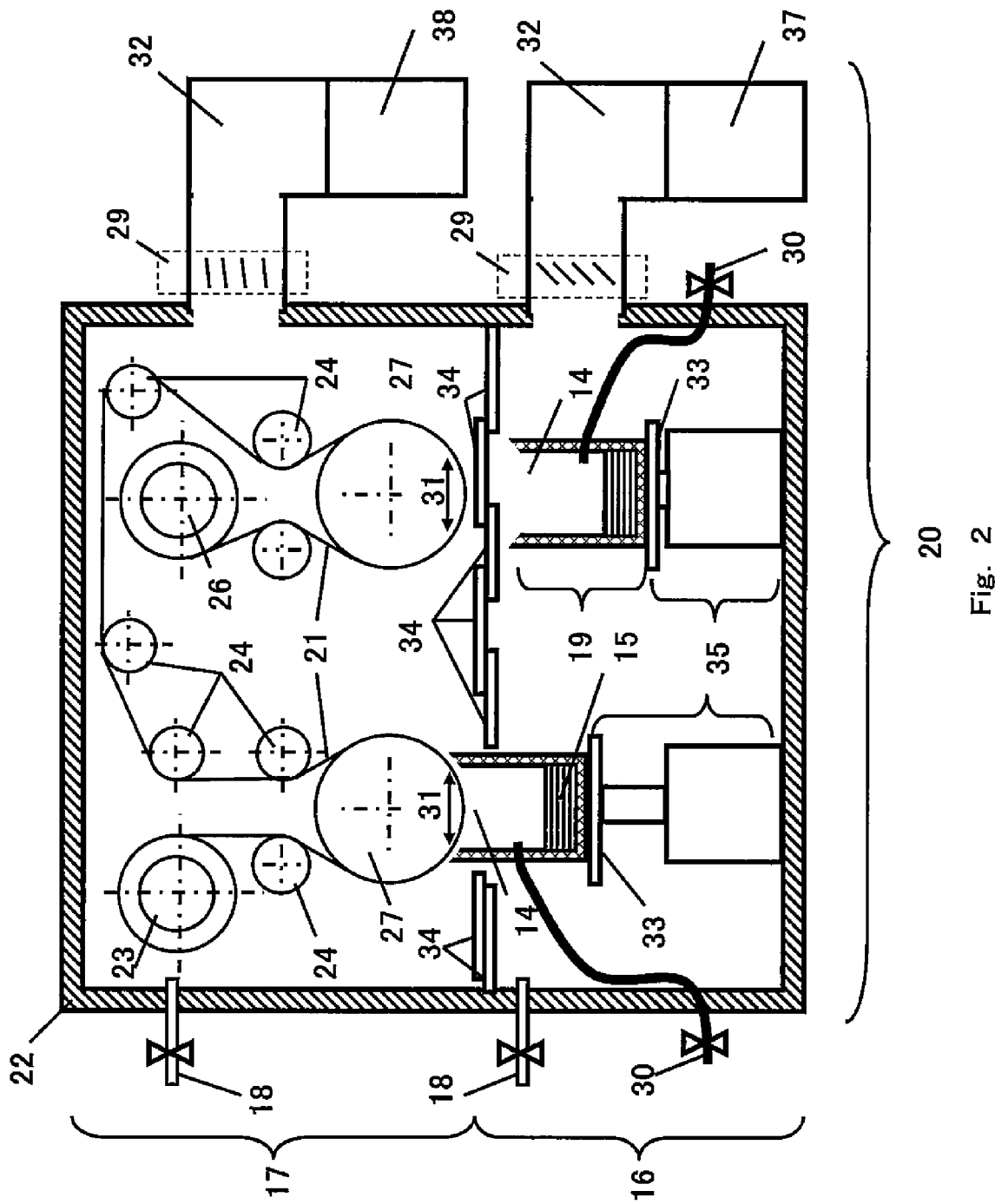
FIG. 2 is a diagram schematically showing another example of the device used in the thin film manufacturing method of the present invention.

The thin film manufacturing method of the present invention is also applicable to a take-up type film forming apparatus. The entire configuration of the take-up type film forming apparatus is schematically shown in FIG. 2. Explanations of the same components as in FIG. 1 are omitted. A core roller A23, a plurality of feed rollers 24, cans 27, and a core roller B26 are accommodated in an internal space of the film forming chamber 17. The evaporation sources 19, the moving mechanisms 35, and film formation reaction gas introduction tubes 30 are accommodated in an internal space of the evaporation chamber 16. The core roller A23 is a roller-like member provided so as to be rotatable about a shaft center thereof. The substrate 21 having an elongated band shape winds around the surface of the core roller A23. The core roller A23 supplies the substrate 21 toward the feed roller 24 located closest to the core roller A23.

Examples of the substrate 21 are various polymer films, various metal foils, a complex of the polymer film and the metal foil, and elongated substrates made of materials other than the above materials. Examples of the polymer film are polyethylene terephthalate, polyethylene naphthalate, polyamide, and polyimide. Examples of the metal foil are aluminum foils, copper foils, nickel foils, titanium foils, and stainless steel foils. For example, the width of the substrate is 50 to 1,000 mm, and a desirable thickness of the substrate is 3 to 150 µm. The productivity deteriorates when the width of the substrate is less than 50 mm. However, this does not mean that the present invention is inapplicable. When the thickness of the substrate is less than 3 µm, the heat capacity of the substrate is extremely small, so that the heat deformation of the substrate easily occurs. However, this does not mean that the present invention is inapplicable. A feed rate of the substrate during the film formation differs depending on the type of the thin film to be formed and conditions for the film formation, but is set to, for example, 0.1 to 500 m/min. A tension applied in the traveling direction of the substrate being fed is suitably selected depending on the material and thickness of the substrate and process conditions, such as a film formation rate.

Each of the feed rollers 24 is a roller-like member provided so as to be rotatable about a shaft center thereof. The feed rollers 24 guide the substrate 21, fed from the core roller A23, to a film forming region 31 to finally guide the substrate 21 to the core roller B26. While the substrate 21 travels the film forming region 31 along the can 27, material particles from the evaporation source are deposited to form a thin film on the surface of the substrate 21. The core roller B26 is a roller-like member provided so as to be rotatable by a driving unit, not shown. The core roller B26 takes up and holds the substrate 21 on which the thin film is formed.

The film forming apparatus used for the thin film manufacturing method of the present invention may further include a unit configured to introduce a film formation gas for reaction film formation. One example of such film formation gas introducing unit is the film formation reaction gas introduction tube 30 shown in FIGS. 1A, 1B, and 2. The film formation reaction gas introduction tube 30 is, for example, a tubular member, one end of which is guided to an inner portion of the evaporation source 19 and the other end of which is connected to a film formation reaction gas supply unit, not shown, provided outside the vacuum chamber 22. The film formation gas, such as oxygen or nitrogen, is supplied through the film formation reaction gas introduction tube 30 to the vapor of the film formation material. With this, the thin film, which contains, as a major component, oxide, nitride, or oxynitride of the film formation material from the evaporation source, is formed on the surface of the substrate 21. Examples of the film formation reaction gas supply unit are a gas bomb and a gas generator.

In the film forming region 31, the substrate 21 receives the vapor from the evaporation source and, according to need, the film formation gas, such as oxygen or nitrogen. Thus, the thin film is formed on the surface of the substrate 21. The substrate 21 on which the thin film is formed is taken up by the core roller B26 through the other feed rollers 24.

As above, according to the film forming apparatus 20 of FIG. 2, the substrate 21 from the core roller A23 travels through the feed rollers 24 to be taken up by the core roller B26. In the middle of this process, in the film forming region 31, the substrate receives the vapor from evaporation source and, according to need, the film formation gas, such as oxygen or nitrogen. Thus, the thin film is formed on the substrate. By these operations, the film forming apparatus 20 can perform the take-up film formation by using the nozzle-type evaporation source 19.

In the film forming apparatus 20 of FIG. 2, two cans 27 and two evaporation sources 19 are provided, and an inverted structure is provided between the two cans. With this, the thin film can be formed on each of the front surface and rear surface of the substrate. However, the take-up type film forming apparatus usable in the present invention is not limited to this. An apparatus including one can 27 and one evaporation source 19 and configured to form the thin film only on one surface of the substrate may be used.

Embodiment 1

One example of embodiments of the thin film manufacturing method of the present invention will be explained. In this embodiment, a lithium film is formed on a lithium ion secondary battery negative electrode made from a silicon thin film. Respective numerical values explained below are just examples and do not limit the present invention.

A roughened copper foil (18 microns in thickness, 100 mm in width) produced by Furukawa Circuit Foil Co., Ltd. is used as a current collector. Used as the substrate of the present invention is a substrate formed such that a silicon multi-layer thin film having a thickness of 8 µm is formed on each of both surfaces of the current collector by vacuum deposition.

First, the silicon multi-layer thin film is formed by using a take-up type deposition apparatus (not shown) in accordance with the following procedure. The pressure in a vacuum chamber having a volume of 0.4 cubic meter and including as exhaust units two oil diffusion pumps each having a bore of 14 inches is decreased up to 0.002 Pascal. Then, silicon that is the film formation material is melted. The silicon is melted by a 270-degree deflection electron beam evaporation source produced by JEOL Ltd. The melted silicon is irradiated with an electron beam having an accelerating voltage of −10 kV and an emission current of 600 mA, and the generated vapor is supplied to the copper foil which is traveling along the can. The feed rate of the current collector is 1 m/min, and an average film formation rate is 80 nm/sec.

A metal mask (the length of each of openings is 100 mm) is provided so as to be spaced apart from the copper foil current collector by about 2 mm such that the width of the silicon thin film formed becomes 85 mm. A copper foil current collector feed mechanism can perform round trips of the current collector. By one-time traveling, one-layer silicon thin films each having a thickness of about 0.5 micron are formed on both surfaces of the current collector. By performing the film formation 16 times while making the round trips, the silicon multi-layer thin films each having a thickness of about 8 microns are formed.

Figure 5:
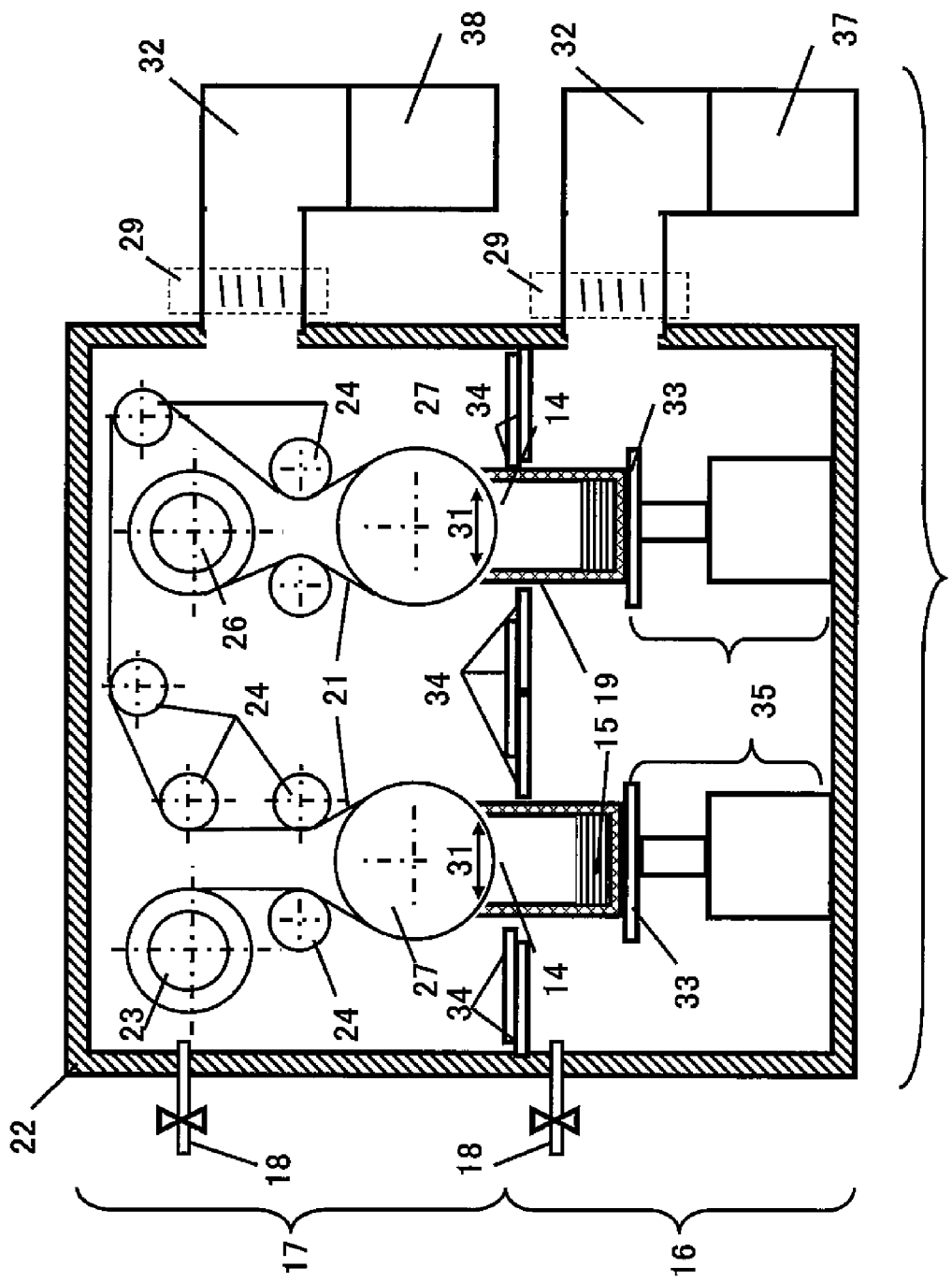
FIG. 5(1) is a diagram schematically showing Embodiment 1 (first step) of the thin film manufacturing method of the present invention.
Figure 5:
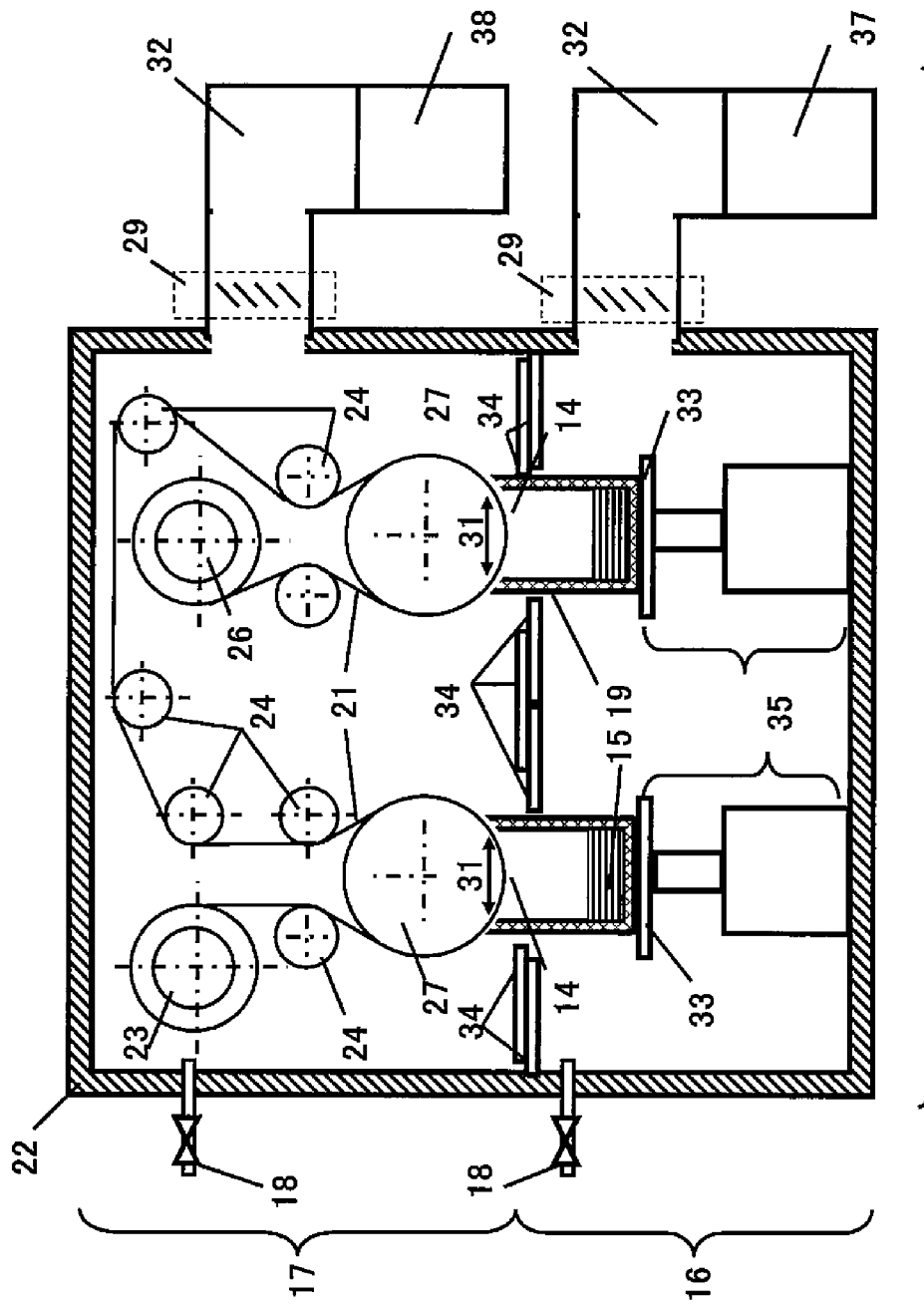
Figure 5:
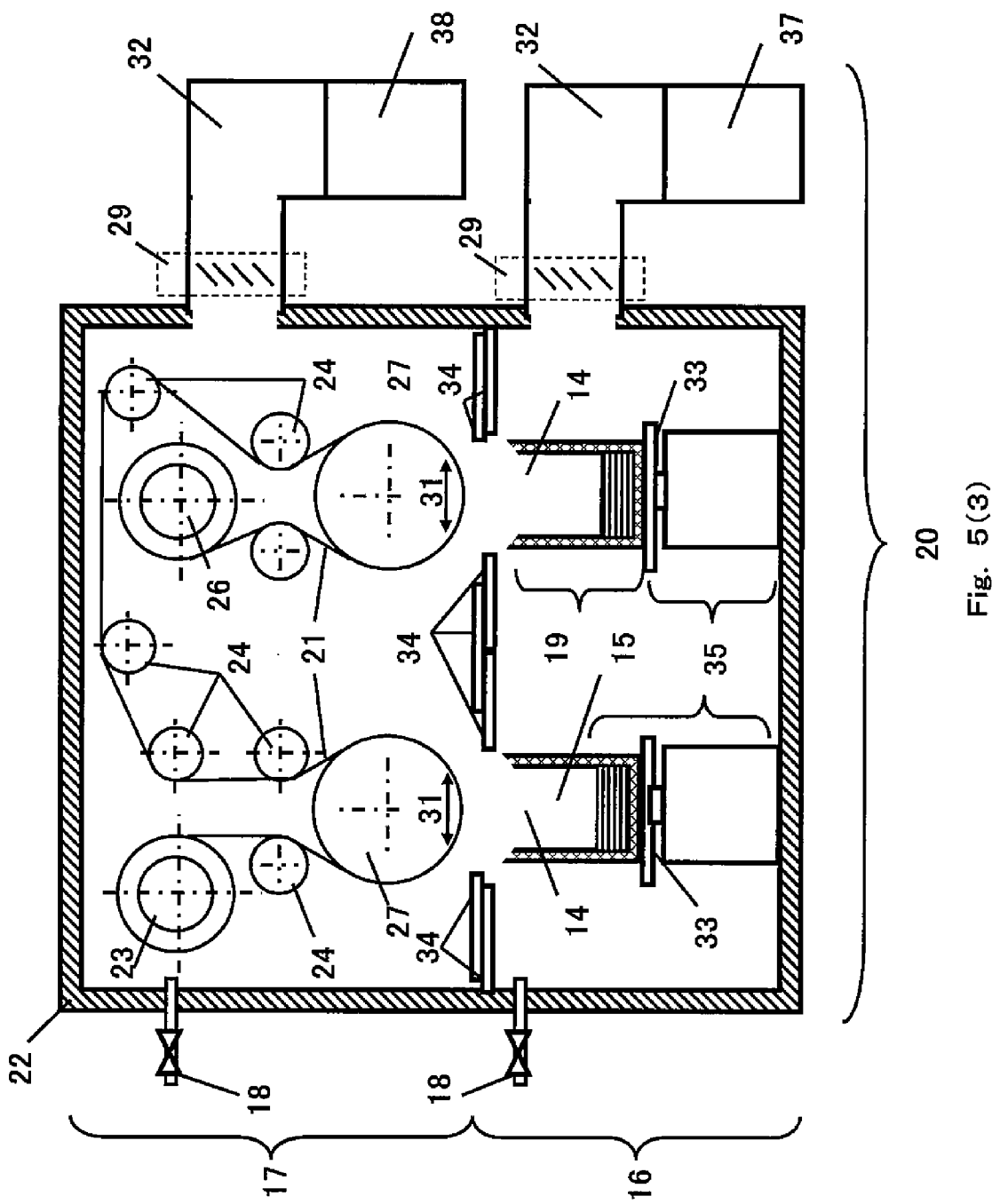
Figure 5:
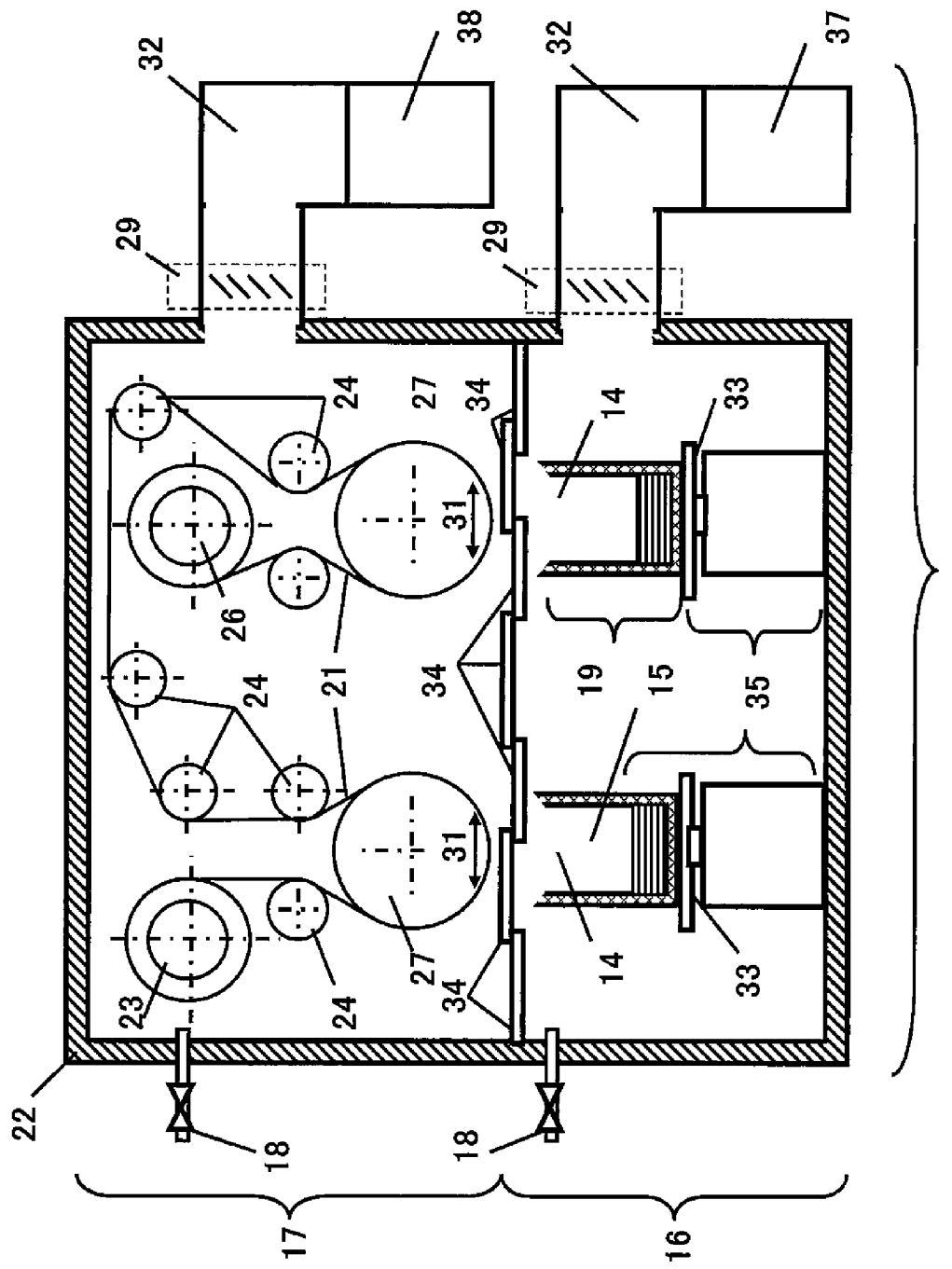
Figure 5:
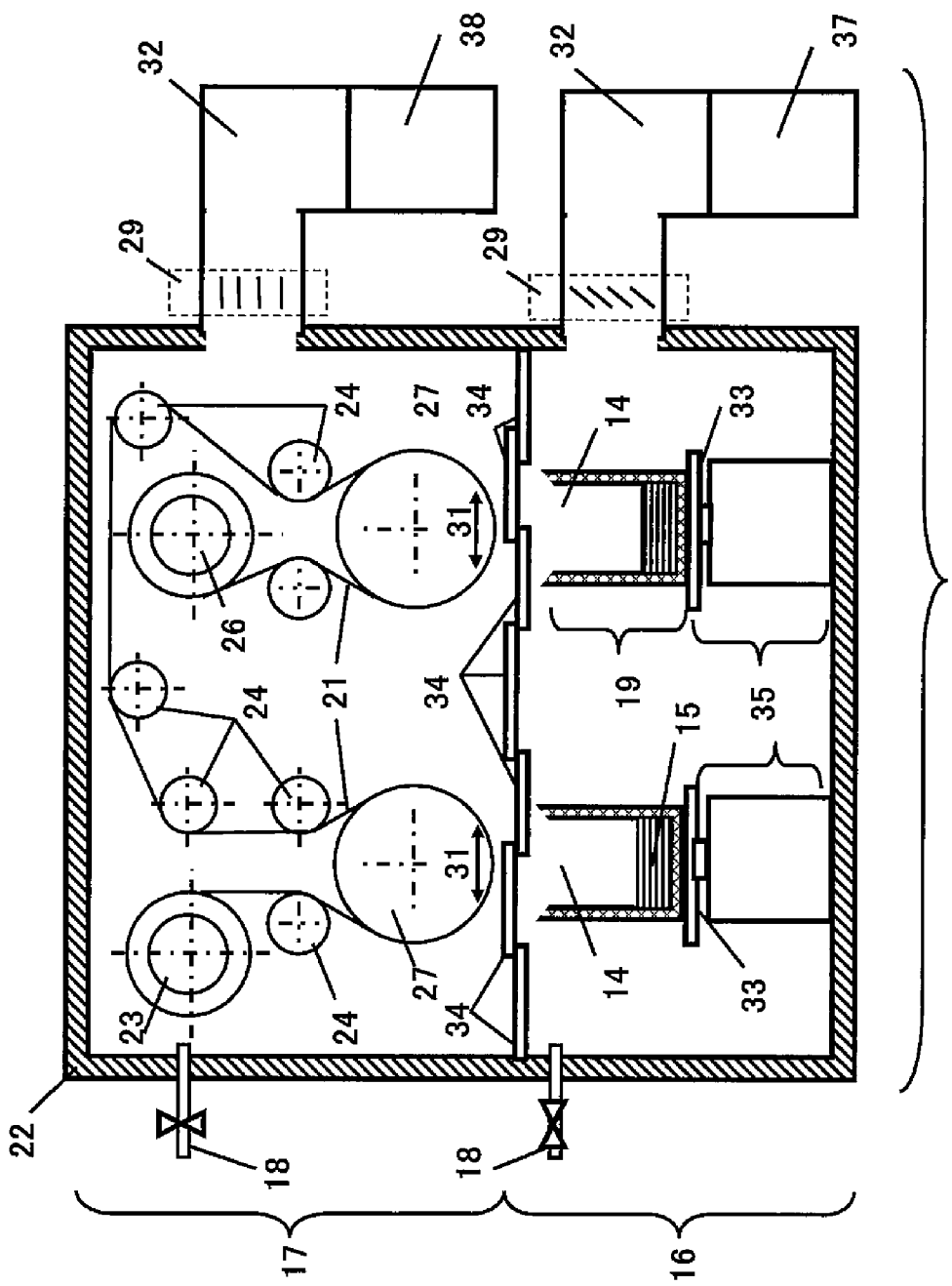

Next, the current collector on which the silicon thin films are formed is used as the substrate, and the lithium films are respectively formed on both surfaces of the substrate by the thin film manufacturing method of the present invention. FIGS. 5(1) to 5(5) are diagrams showing steps of Embodiment 1. In FIGS. 5(1) to 5(5), the same reference signs are used for the same components as in FIG. 2, and explanations thereof are omitted. The melting point of the lithium is 180° C.

First Step

As shown in FIG. 5(1), the substrate 21 on which the silicon thin films are formed in advance is attached to the core roller A23. The substrate 21 is provided along a feed route extending from the core roller A23 through the feed rollers 24 and the cans 27 to the core roller B26. After vacuum rough pumping, the evaporation chamber and the film forming chamber are evacuated up to high vacuum by the 14-inch oil diffusion pumps 37 and 38. Thus, the pressure in each of the evaporation chamber and the film forming chamber is adjusted to 0.005 Pa. At this time, the conductance variable structure 34 realizes a communication state (cancellation of the differential pressure structure) where the conductance between the evaporation chamber 16 and the film forming chamber 17 is maximum. The conductance valve 29 between the evaporation chamber and the main valve and the conductance valve 29 between the film forming chamber and the main valve are fully open, and the nonreactive gas is not introduced. The opening surface 14 is formed at the upper portion of the evaporation source 19. The opening surface is curved so as to conform to the shape of the can such that the opening surface can be located close to the substrate on the can. The evaporation source is a nozzle-type evaporation source including a stainless steel wall surface and a heat source. 20 g of metal lithium is accommodated in the internal space of the evaporation source. The evaporation source is moved up by the moving mechanism, so that the opening surface and the substrate are located close to each other. With this, the distance between the can and the opening surface is set to about 3 mm. The film formation material is heated to 480° C. While the substrate is caused to travel at a take-up travel rate of 2 m/min, the film formation is performed with respect to the traveling substrate. With this, the lithium film having a thickness of about 1.5 microns is formed on the substrate. The lithium film reacts with and is absorbed in the silicon thin film immediately after the film formation.

Second Step

After the predetermined film formation is completed in the first step, as shown in FIG. 5(2), the position of the evaporation source and the state of the conductance variable structure are maintained, and argon (nonreactive gas) is introduced at 100 sccm to each of the evaporation chamber and the film forming chamber. In addition, each of the two conductance valves 29 is set to a preset semiclosed state. Thus, the pressure in each of the evaporation chamber and the film forming chamber is increased up to 0.2 Pa while preventing the load applied to the main pump from becoming excessively high. By the pressure in these chambers, the evaporation of the melted film formation material is suppressed. The setting of a semiopen state of the conductance valve 29 is performed by obtaining in advance such an opening degree that the pressure of the nonreactive gas in each of the evaporation chamber and the film forming chamber when argon is introduced at 100 sccm to each of the evaporation chamber and the film forming chamber becomes 0.2 Pa in a state where the conductance variable structure 34 is substantially shut off such that the conductance between the evaporation chamber 16 and the film forming chamber 17 becomes minimum. In the second step, the heating of the evaporation source may be terminated. After the portion on which the film is formed is taken up, the traveling of the substrate may also be stopped.

Third Step

While maintaining the pressure in each of the film forming chamber and the evaporation chamber, as shown in FIG. 5(3), the positions of the evaporation sources are lowered by the moving mechanisms, so that the opening surfaces of the evaporation sources are located away from the substrate. With this, the positions of the evaporation sources are set such that the communication between the evaporation chamber 16 and the film forming chamber 17 can be shut off by the conductance variable structure 34 in the next step.

Fourth Step

As shown in FIG. 5(4), the conductance variable structure is activated to substantially shut off the communication between the evaporation chamber 16 and the film forming chamber 17 such that the conductance between these chambers becomes minimum. At this time, the introduction of the argon and the evacuation are continuously performed, and the pressure in each of the evaporation chamber and the film forming chamber is maintained at 0.2 Pa.

Fifth Step

As shown in FIG. 5(5), the introduction of the argon to the film forming chamber is stopped, and the conductance valve 29 between the film forming chamber and the main valve is fully opened. The introduction of the argon to the evaporation chamber is continued to maintain the above pressure. However, when the temperature of the evaporation source is decreased up to 300° C., the amount of argon introduced is decreased to 50 sccm, and the conductance valve 29 between the evaporation chamber and the main valve is fully opened. At this time, the pressure in the evaporation chamber is set to about 0.05 Pa.

The process is completed when the evaporation source is cooled up to a predetermined temperature. Then, it is possible to shift to a preparation for opening the evaporation chamber and the film forming chamber to the normal pressure.

Embodiment 2

Another example of the embodiments of the thin film manufacturing method of the present invention will be explained. In this embodiment, the lithium film is formed on the lithium ion secondary battery negative electrode made from the silicon oxide thin film. Respective numerical values explained below are just examples and do not limit the present invention.

A roughened copper foil (18 microns in thickness, 100 mm in width) produced by Furukawa Circuit Foil Co., Ltd. is used as a current collector. Used as the substrate of the present invention is a substrate formed such that a silicon oxide multi-layer thin film having a thickness of 15 μm is formed on each of both surfaces of the current collector by vacuum deposition.

First, the silicon oxide multi-layer thin film is formed by using a take-up type deposition apparatus (not shown) in accordance with the following procedure. The pressure in a vacuum chamber having a volume of 0.4 cubic meter and including as exhaust units two oil diffusion pumps each having a bore of 14 inches is decreased up to 0.002 Pascal. Then, silicon that is the film formation material is melted. The silicon is melted by a 270-degree deflection electron beam evaporation source produced by JEOL Ltd. The melted silicon is irradiated with an electron beam having an accelerating voltage of –10 kV and an emission current of 950 mA, and the generated vapor is supplied to the copper foil which is traveling along the can. The feed rate of the current collector is 1 m/min, and the average film formation rate is 160 nm/sec.

A metal mask (the length of each of openings is 100 mm) is provided so as to be spaced apart from the copper foil substrate by about 2 mm such that the width of the silicon thin film formed becomes 85 mm. In addition, an oxygen gas is supplied at 60 sccm toward the openings of the metal mask from a reactant gas nozzle provided on a film formation surface side of the copper foil current collector. With this, the silicon oxide thin films are formed on the copper foil substrate. The copper foil current collector feed mechanism can perform round trips of the current collector. By one-time traveling, one-layer silicon thin films each having a thickness of about 1 micron are formed on both surfaces of the current collector. By performing the film formation 15 times while making the round trips, the silicon oxide multi-layer thin films each having a thickness of about 15 microns are formed.

Next, the current collector on which the silicon oxide thin films are formed is used as the substrate, and the lithium films are formed on both surfaces of the substrate by the thin film manufacturing method of the present invention. FIGS. 6(1) to 6(5) are diagrams showing steps of Embodiment 2. In FIGS. 6(1) to 6(5), the same reference signs are used for the same components as in FIG. 2, and explanations thereof are omitted. In FIGS. 6(1) to 6(5), the film forming chamber and the evaporation chamber are provided next to each other along a horizontal direction, and the evaporation source 19 has the opening surface on the side surface thereof. The moving mechanism causes the evaporation source 19 to move in the horizontal direction.

First Step

As shown in FIG. 6(1), the substrate 21 on which the silicon thin films are formed in advance is attached to the core roller A23. The substrate 21 is provided along a feed route extending from the core roller A23 through the feed rollers 24 and the cans 27 to the core roller B26. After vacuum rough pumping, the evaporation chamber and the film forming chamber are evacuated up to high vacuum by the 14-inch oil diffusion pumps 37 and 38. Thus, the pressure in each of the evaporation chamber and the film forming chamber is adjusted to 0.005 Pa. At this time, the conductance variable structure 34 realizes a communication state (cancellation of the differential pressure structure) where the conductance between the evaporation chamber 16 and the film forming chamber 17 is maximum. The conductance valve 29 between the evaporation chamber and the main valve and the conductance valve 29 between the film forming chamber and the main valve are fully open, and the nonreactive gas is not introduced. The opening surface 14 is formed on the side surface of the evaporation source 19. The opening surface is curved so as to conform to the shape of the can such that the opening surface can be located close to the substrate on the can. The evaporation source is a nozzle-type evaporation source including a stainless steel wall surface and a heat source. 20 g of metal lithium is accommodated in the internal space of the evaporation source. The evaporation source is moved up by the moving mechanism, so that the opening surface and the substrate are located close to each other. With this, the distance between the can and the opening surface is set to about 3 mm. The film formation material is heated to 500° C. While the substrate is caused to travel at a take-up travel rate of 1 m/min, the film formation is performed with respect to the traveling substrate. With this, the lithium film having a thickness of about 6 microns is formed on the substrate. The lithium film reacts with and is absorbed in the silicon thin film immediately after the film formation.

Second Step

After the predetermined film formation is completed in the first step, as shown in FIG. 6(2), the position of the evaporation source and the state of the conductance variable structure are maintained, and argon (nonreactive gas) is introduced at 150 sccm to each of the evaporation chamber and the film forming chamber. In addition, each of the two conductance valves 29 is set to a preset semiclosed state. Thus, the pressure in each of the evaporation chamber and the film forming chamber is increased up to 0.4 Pa while preventing the load applied to the main pump from becoming excessively high. By the pressure in these chambers, the evaporation of the melted film formation material is suppressed. The setting of a semiopen state of the conductance valve 29 is performed by obtaining in advance such an opening degree that the pressure of the nonreactive gas in each of the evaporation chamber and the film forming chamber when argon is introduced at 150 sccm to each of the evaporation chamber and the film forming chamber becomes 0.4 Pa in a state where the conductance variable structure 34 is substantially shut off such that the conductance between the evaporation chamber 16 and the film forming chamber 17 becomes minimum. In the second step, the heating of the evaporation source may be terminated. After the portion on which the film is formed is taken up, the traveling of the substrate may also be stopped.

Third Step

While maintaining the pressure in each of the film forming chamber and the evaporation chamber, as shown in FIG. 6(3), the positions of the evaporation sources are moved to the right by the moving mechanisms, so that the opening surfaces of the evaporation sources are located away from the substrate. With this, the positions of the evaporation sources are set such that the communication between the evaporation chamber 16 and the film forming chamber 17 can be shut off by the conductance variable structure 34 in the next step.

Fourth Step

As shown in FIG. 6(4), the conductance variable structure is activated to substantially shut off the communication between the evaporation chamber 16 and the film forming chamber 17 such that the conductance between these chambers becomes minimum. At this time, the introduction of the argon and the evacuation are continuously performed, and the pressure in each of the evaporation chamber and the film forming chamber is maintained at 0.4 Pa.

Fifth Step

As shown in FIG. 6(5), the introduction of the argon to the film forming chamber is stopped, and the conductance valve 29 between the film forming chamber and the main valve is fully opened. The introduction of the argon gas to the evaporation chamber is continued to maintain the above pressure. However, when the temperature of the evaporation source is decreased up to 450° C., the amount of argon introduced is decreased to 100 sccm, and the conductance valve 29 between the evaporation chamber and the main valve is adjusted such that the pressure in the evaporation chamber is set to 0.2 Pa. Further, when the temperature of the evaporation source is decreased up to 300° C., the amount of argon introduced is decreased to 50 sccm, and the conductance valve 29 between the evaporation chamber and the main valve is fully opened. At this time, the pressure in the evaporation chamber is set to about 0.05 Pa.

The process is completed when the evaporation source is cooled up to a predetermined temperature. Then, it is possible to shift to a preparation for opening the evaporation chamber and the film forming chamber to the normal pressure.

The foregoing has specifically explained the embodiments of the present invention. However, the present invention is not limited to these embodiments. Various materials other than lithium can be used as the film formation material, and examples are various metals and organic materials which can be heated and evaporated. In this case, a constituent material of the evaporation source may be suitably selected such that the film formation material and the constituent material of the evaporation source do not melt or do not react with each other, such as do not alloy, at a temperature at which desired vapor pressure is achieved.

As a specific application example, the foregoing has explained a case where the lithium ion secondary battery negative electrode is formed. However, the present invention is not limited to this. According to the present invention, for example, a polar plate for an electrochemical capacitor may be formed. The present invention is applicable to various fields, such as organic thin films, decoration films, solar batteries, gas barrier films, various sensors, and various optical films, which require highly-efficient, stable film formation. Further, the present invention is applicable to the thin film manufacturing method used when producing various devices.

INDUSTRIAL APPLICABILITY

According to the thin film manufacturing method of the present invention, in the film formation using the nozzle-type evaporation source, the evacuation time can be shortened, the film quality can be increased, the material use efficiency can be improved, and the contamination of the vacuum chamber by the material scattering can be prevented. In addition, since the thin film manufacturing method of the present invention can be combined with various substrate feed systems, the thin film manufacturing method which achieves highly-efficient, stable film formation can be realized.

REFERENCE SIGNS LIST 14 opening surface
15 film formation material
16 evaporation chamber
17 film forming chamber
18 nonreactive gas introduction mechanism
19 evaporation source
20 film forming apparatus
21 substrate
22 vacuum chamber
23 core roller A
24 feed roller
26 core roller B
27 can
29 conductance valve
30 film formation reaction gas introduction tube
31 film forming region
32 main valve
33 stage
34 conductance variable structure
35 moving mechanism
37 vacuum pump
38 vacuum pump

The invention claimed is:

1. A method of manufacturing a thin film in a film forming apparatus,
the film forming apparatus comprising:
an evaporation chamber;
a film forming chamber which is provided adjacent to the evaporation chamber and in which a substrate is provided;
vacuum pumps respectively connected to the evaporation chamber and the film forming chamber;
a nonreactive gas introduction mechanism connected to one or both of the evaporation chamber and the film forming chamber;
an evaporation source provided in the evaporation chamber, holding a film formation material, and having a semi-sealed structure including an opening face;
a moving mechanism configured to cause the evaporation source to move such that the opening face is able to be located close to the substrate; and
a conductance variable structure provided between the evaporation chamber and the film forming chamber,
the method comprising:
a first step of performing film formation on the substrate in a state where the opening face of the evaporation source holding the heated film formation material is located in the film formation chamber and close to the substrate while evacuating the evaporation chamber and the film forming chamber without shutting off communication between the evaporation chamber and the film forming chamber by the conductance variable structure;
a second step of suppressing evaporation of the film formation material by introducing a nonreactive gas to the evaporation chamber and the film forming chamber to adjust pressure in each of the evaporation chamber and the film forming chamber to a predetermined pressure or more while maintaining a state where the communication between the evaporation chamber and the film forming chamber is not shut off;
a third step of securing a space necessary for shutting off the communication between the evaporation chamber and the film forming chamber by causing the evaporation source to move by the moving mechanism such that the opening face passes through the conductance variable structure and is located away from the substrate;
a fourth step of activating the conductance variable structure to shut off the communication between the evaporation chamber and the film forming chamber; and
a fifth step of cooling the film formation material while continuously introducing the nonreactive gas to the evaporation chamber,
wherein during the third to fifth steps, each of the pressure in the film forming chamber and the pressure in the evaporation chamber is maintained at the predetermined pressure or more and
when the opening face passes through the conductance variable structure in the third step, the opening face faces the substrate.

2. The method according to claim 1, wherein the predetermined pressure is twice or more as high as vapor pressure of the film formation material heated in the first step.

3. The method according to claim 1, wherein in the second step to the fifth step, an amount of the nonreactive gas introduced to each of the evaporation chamber and the film forming chamber is decreased in accordance with temperature decrease of the film formation material in the evaporation source.

4. The method according to claim 1, wherein the second step to the fifth step are performed while evacuating the evaporation chamber and the film forming chamber at an evacuating rate lower than an evacuating rate in the first step.

* * * * *